(12) United States Patent
Yamazaki

(10) Patent No.: US 6,956,324 B2
(45) Date of Patent: Oct. 18, 2005

(54) SEMICONDUCTOR DEVICE AND MANUFACTURING METHOD THEREFOR

(75) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 184 days.

(21) Appl. No.: 09/917,677

(22) Filed: Jul. 31, 2001

(65) Prior Publication Data

US 2002/0030440 A1 Mar. 14, 2002

(30) Foreign Application Priority Data

Aug. 4, 2000 (JP) ........................................ 2000-236881
Sep. 19, 2000 (JP) ........................................ 2000-283944
Sep. 19, 2000 (JP) ........................................ 2000-283998

(51) Int. Cl.[7] ............................................. H01L 21/00
(52) U.S. Cl. ........................ 313/506; 313/498; 313/509
(58) Field of Search ................................ 313/498–509, 313/512; 445/23–25; 438/151, 156, 157, 166; 257/350

(56) References Cited

U.S. PATENT DOCUMENTS

| | | | |
|---|---|---|---|
| 5,986,401 A | | 11/1999 | Thompson et al. |
| 5,998,803 A | * | 12/1999 | Forrest et al. ............... 313/504 |
| 6,262,441 B1 | | 7/2001 | Böhler et al. |
| 6,274,887 B1 | | 8/2001 | Yamazaki et al. |
| 6,284,393 B1 | | 9/2001 | Hosokawa et al. |
| 6,297,495 B1 | | 10/2001 | Bulovic et al. |
| 6,307,528 B1 | * | 10/2001 | Yap .............................. 313/504 |
| 6,380,007 B1 | * | 4/2002 | Koyama ..................... 438/151 |
| 6,447,612 B1 | * | 9/2002 | Moriyama et al. .......... 118/718 |
| 6,515,310 B2 | | 2/2003 | Yamazaki et al. |
| 6,639,354 B1 | * | 10/2003 | Kojima et al. .............. 313/498 |
| 6,784,037 B2 | | 8/2004 | Yamazaki et al. |
| 6,858,878 B2 | | 2/2005 | Yamazaki et al. |
| 2005/0001541 A1 | | 1/2005 | Yamazaki et al. |

OTHER PUBLICATIONS

C.C. Wu et al; "Integration of Organic LED's and Amorphous Si TFT's onto Unbreakable Metal Foil Substrates"; *1996 International Electron Devices Meeting—Technical Digest*; pp. 957–959; Dec. 8–11, 1996.

Shunpei Yamazaki et al.; U.S. Appl. No. 09/848,233; filed May 4, 2001 (patent pending).

* cited by examiner

*Primary Examiner*—Nimeshkumar D. Patel
*Assistant Examiner*—Sharlene Leurig
(74) *Attorney, Agent, or Firm*—Fish & Richardson P.C.

(57) ABSTRACT

A light weight and a low cost EL display device is provided, in which light emitting elements are formed on a flexible film. A thin metallic substrate is used as an element forming substrate with the present invention, edge portions of the metallic substrate are bent, and the metallic substrate is attached with good adhesion, within a vacuum, to a substrate holder which possesses curvature in its edge portions. After then forming light emitting elements on the thin metallic substrate, the substrate holder is separated.

27 Claims, 17 Drawing Sheets

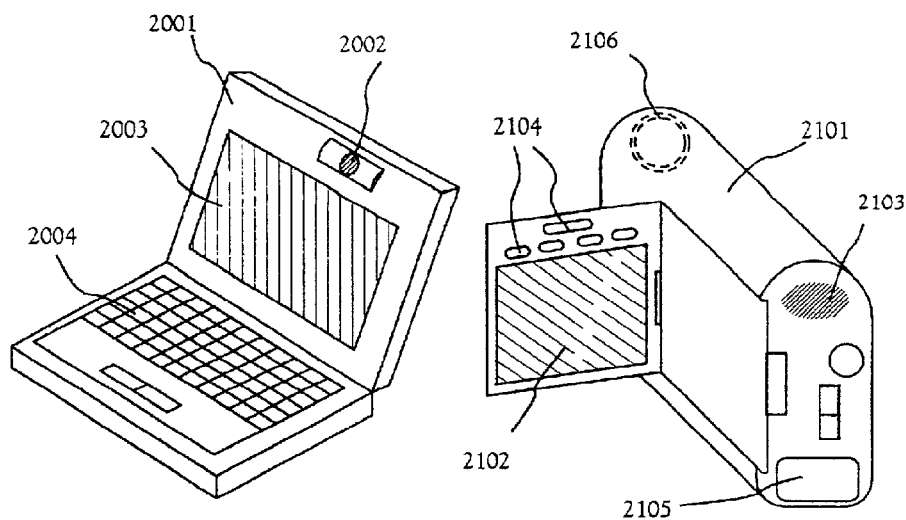
FIG. 16A
FIG. 16B
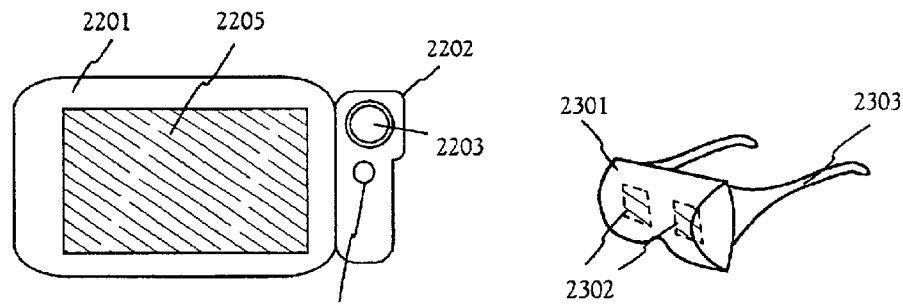
FIG. 16C
FIG. 16D
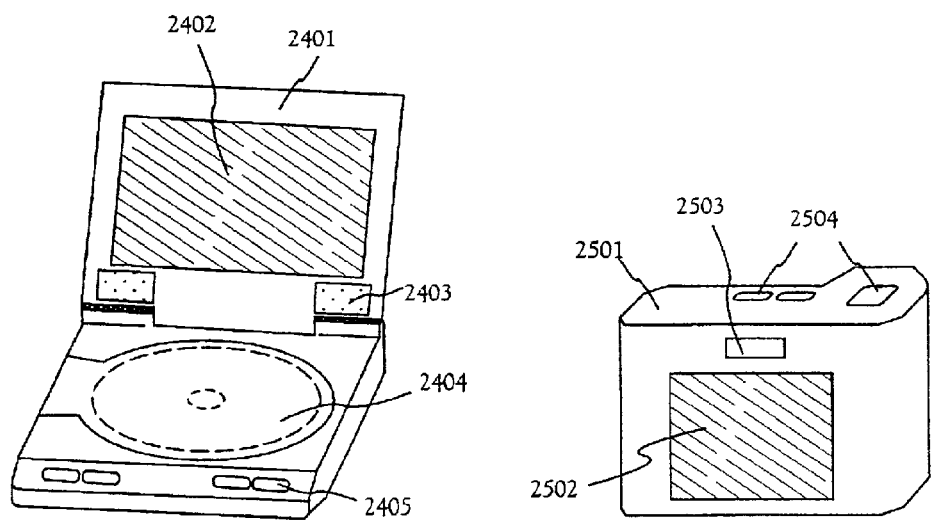
FIG. 16E
FIG. 16F

SEMICONDUCTOR DEVICE AND MANUFACTURING METHOD THEREFOR

BACKGROUND OF THE INVENTION

1. Field of the Invention

The present invention relates to a device (hereafter referred to as a light emitting device) having an element (hereafter referred to as a tight emitting element) in which a thin film made from a light emitting material is sandwiched between a pair of electrodes (an anode and a cathode). In particular, the present invention relates to a light emitting device having a light emitting element which uses a thin film made from a light emitting material in which EL (electroluminescence) is obtained (the light emitting element is hereafter referred to as an EL element).

2. Description of the Related Art

The development of light emitting devices having EL elements (hereafter referred to as EL light emitting devices) has advanced in recent years. Passive matrix and active matrix type EL light emitting devices exist, and each type operates by the principle in which a thin film, made from a light emitting material in which EL is obtained in accordance with the flow of electric current, within the EL element is made to emit light.

Various applications can be expected to utilize this type of EL display device, but its use in portable devices, in particular, due to the thinness of the EL display device and its light weight have been in the spotlight. The formation of light emitting elements on flexible plastic films have therefore been tested.

TFTs having electrical properties nearly as good as those of TFTs formed on glass substrates cannot be formed at present without lowering the maximum process temperature because the heat resistance of plastic films is low. High performance light emitting devices using plastic films have therefore not been achieved.

Further, a structure of a general EL element is shown in FIG. 18. An anode 12, a light emitting layer 13, and a cathode 14 are laminated on an insulating body 11 in FIG. 18, forming an EL element 10. A metallic electrode having a small work coefficient is generally used in the cathode 14, which is a supply source for electrons, and an oxide conductive film having a large work coefficient and which is transparent with respect to visible light (typically an ITO film) is used in the anode 12, which is a supply source for holes. This is done because the cathode 14, made from the metallic electrode, is not transparent with respect to visible light, and therefore light generated by the light emitting layer (hereafter referred to as EL light) cannot be observed.

In this case, EL light 15 passes directly through the anode 12 and is observed, or passes through the anode 12 after being reflected by the cathode 14 and is then observed. Namely, an observer 16 can observe the EL light 15 which has passed through the anode 12 for pixels in which the light emitting layer 13 emits light.

However, outside light 17 (light from outside the light emitting device) made incident to pixels which do not generate light is reflected by the rear surface of the anode (the surface contacting the light emitting layer), and there is a problem in that the rear surface of the cathode acts as a mirror and the external environment is shown on the observation surface (surface pointed toward an observer). Further, in order to avoid this problem, there is a method in which a circular polarizing film is attached to the observation surface of the EL light emitting device so that the external environment is not shown on the observation surface, but the circular polarizing film is extremely expensive, and thus invites a further problem of an increase in production costs.

SUMMARY OF THE INVENTION

In light of the above stated problems, an object of the present invention is to provide a low cost EL light emitting device in which a light emitting element is formed on a flexible film. In addition, an object of the present invention is to provide a low cost electronic device having the EL light emitting device as a display portion.

Furthermore, an object of the present invention is to provide a low cost EL light emitting device in which the cost of manufacturing the EL light emitting device is reduced by preventing the EL light emitting device from being made into a mirrored surface without using a circular polarizing film.

An EL light emitting device having a light emitting element formed on a flexible metallic substrate, and which is made light weight, is obtained by using a thin metallic substrate, not a plastic substrate, as an element forming substrate.

A structure of the present invention disclosed by this specification is a light emitting device having: an insulating film on a substrate possessing a metallic surface; and a light emitting element on the insulating film, characterized in that:

the light emitting element is prepared with an anode, a cathode, and an EL material sandwiched between the anode and the cathode.

Further, another structure of the present invention is a light emitting device having: an insulating film on a substrate possessing a metallic surface; and a light emitting element on the insulating film, characterized in that:

the light emitting element is prepared with an anode, a cathode, and an EL material sandwiched between the anode and the cathode; and a light shielding film is formed contacting the cathode, or is formed through an insulating film or a conductive film. A thin film made from a material having a high absorption coefficient with respect to visible light can be used as the light shielding film. Typically, an insulating film (preferably a resin film) in which metallic particles or carbon particles are distributed; a metallic film having a low reflectivity (preferably a titanium film, a titanium nitride film, a chromium film, a molybdenum film, a tungsten film, a tantalum film, or a tantalum nitride film); or a semiconductor film can be used.

Further, the substrate having a metallic surface in the above structure is a metallic substrate having heat resistive properties. The thickness of the heat resistive substrate is from 5 $\mu$m to 30 $\mu$m. In addition, the maximum surface roughness (Rmax) of the substrate having a metallic surface is equal to or less than 1 $\mu$m. Furthermore, the radius of curvature of convex portions existing on the surface of the substrate having a metallic surface is equal to or greater than 1 $\mu$m.

In order to achieve the above structures with the present invention, edge portions of a thin metallic film are bent, and after fixing the substrate to a substrate holder, possessing curvature in its edge portions, in a vacuum and with good adhesion, a light emitting element is formed on the thin metallic substrate. The substrate is next separated from the substrate holder.

Further, a structure of the present invention for achieving the above structures is a method of manufacturing a light emitting device, having:

a step for bending edge portions of a substrate having a metallic surface, and fixing the substrate to a substrate holder;

a step for forming an insulating film on the substrate having a metallic surface;

a step for forming a light emitting element on the insulating film; and a step for separating the substrate from the substrate holder.

The above fixing step is performed within a vacuum, and is performed at a temperature from room temperature to 400° C.

In addition, the edge portions of the substrate holder have curvature. The substrate holder has the same thermal expansion coefficient as that of the substrate having a metallic surface. Furthermore, the substrate having a metallic surface is a metallic substrate with heat resistive properties. The thickness of the heat resistant metallic substrate is from 5 $\mu$m to 30 $\mu$m. Additionally, the substrate holder is made from stainless steel, ceramic or from $Al_2O_3$. The substrate holder has a thickness of 500 $\mu$m to 1000 $\mu$m.

Note that the above stated term heat resistant metallic substrate indicates a substrate made from a metallic material having thermal resistance, such as W, Ni, or stainless steel.

Note also that the term stainless steel indicates steel (an alloy of iron and carbon) containing approximately 12% or more of chromium, and that stainless steels are roughly divided into martensite steels, ferrite steels, and austenite steels depending upon their constitution. Note that the term stainless steel also includes stainless steels to which one element, or a plurality of elements selected from the group consisting of Ti, Nb, Mo, Cu, Ni, and Si is added.

BRIEF DESCRIPTION OF THE DRAWINGS

FIGS. 16A to 16F are diagrams showing examples of electronic equipment of Embodiment 16;

DETAILED DESCRIPTION OF THE PREFERRED EMBODIMENTS

[Embodiment Mode]

An embodiment mode of the present invention is explained below.

First, a metallic substrate 102 having heat resistive properties and which becomes an element substrate, and a substrate holder 101 are prepared. A stainless steel substrate is used as the metallic substrate 102 (substrate having a metallic surface). The thickness of the substrate 102 is from 10 $\mu$m to 30 $\mu$m. Further, a stainless steel substrate having a thickness greater than that of the metallic substrate 102 is prepared as the substrate holder 101. A stainless steel substrate having a thickness of 500 $\mu$m to 1000 $\mu$m is used as the substrate holder 101. In addition, ceramic or alumina ($Al_2O_3$) can also be used as the substrate holder 101.

Figure 1A:
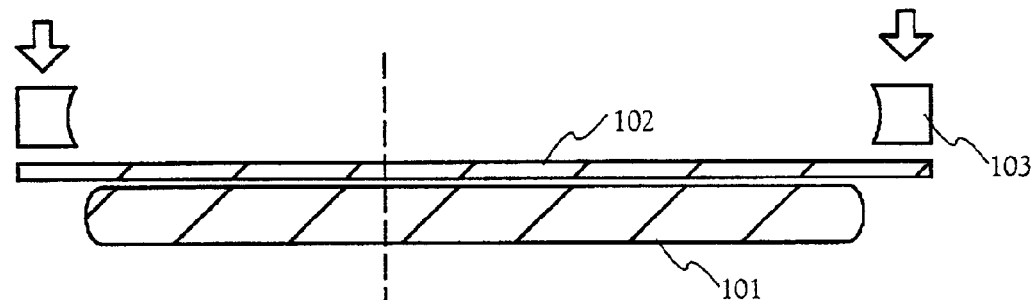
FIGS. 1A to 1C are diagrams showing a process for fixing a substrate to a substrate holder of the present invention.
Figure 1B:
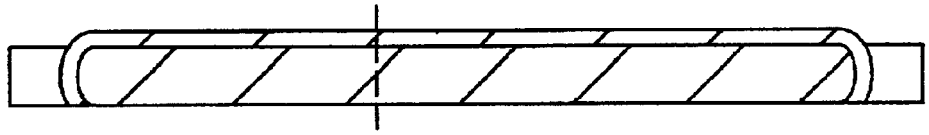

Next, as shown in FIG. 1A, the substrate holder 101, possessing curvature, and the metallic substrate 102 are fixed together in at least their edge portions such that air cannot enter between the substrate, and the edge portions of the metallic substrate are fixed using an additional fixing portion 103, strengthening the adhesiveness. The fixed state is shown in FIG. 1B. The metallic substrate 102 and the substrate holder 101 are fixed together by embedding the substrate holder 101, with the fixing portion 103 as a frame, without using an adhesive. Further, the edge portions of the metallic substrate may also be fixed to the substrate holder with tape or band in the fixing portion. Note that it is preferable to perform a process for fixing the metallic substrate 102 to the substrate holder 101, making them airtight, in a vacuum and at a temperature from room temperature to 400° C., so that air does not enter the space between both substrates. Furthermore, the metallic substrate 102 may also be adhered to the substrate holder by covering it with the substrate holder while applying an expanding force to the substrate, and if necessary, pressing hard.

It is preferable that the maximum value of the surface roughness Rmax of the unevenness of the metallic substrate surface after fixing be equal to or less than 1 $\mu$m, that is, almost level. Note that the maximum surface roughness Rmax is found in accordance with JIS B-0601 (JIS: Japanese Industrial Standards). Conversely, it is preferable that the difference between high and low points be 1 $\mu$m per 1 square mm of surface area of the uneven surface in the metallic substrate after fixing. In addition, the radius of curvature of a convex portion of the unevenness is made equal to or greater than 1 $\mu$m, preferably equal to or greater than 10 $\mu$m. A known technique of increasing the levelness of the surface of the metallic substrate, a polishing process referred to as CMP (chemical mechanical polishing) for example, may also be used.

Next, after forming a base insulating film on the metallic substrate 102, necessary elements are formed on the base insulating film. Note that, although the surface of the base insulating film is shown as level in order to simplify the explanation, a step develops in practice in portions at which the fixing portion and the metallic substrate contact. It is necessary for the process temperature to be equal to or less than 350° C. if a plastic substrate is used as the element forming substrate. The element forming substrate is a metallic substrate with the present invention, however, and therefore heat treatment becomes possible at a temperature greater than 350° C. Note that it is preferable that the thermal expansion coefficient of the substrate holder and that of the metallic substrate be equal so that the substrates do not separate from each other due to heat treatment during element formation processes. An example of forming a driver circuit 104 and a pixel portion 105 having EL elements is shown here. (See FIG. 1C.)

Figure 1C:
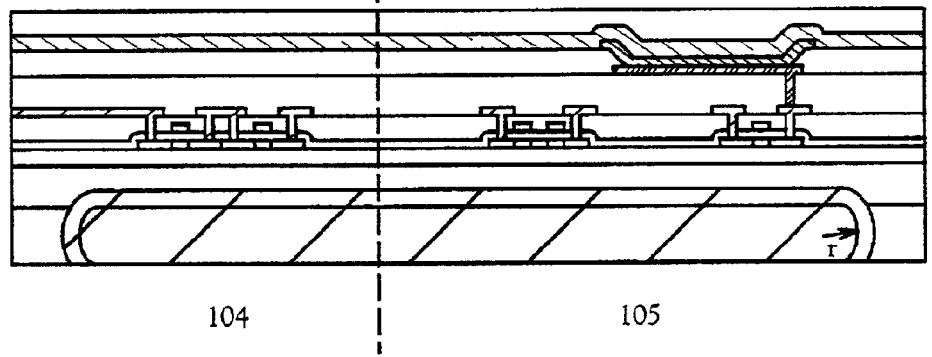

Further, the radius of curvature r in the edge portions of the substrate holder shown in FIG. 1C is greater than or equal to 300 μm, and less than or equal to 30 cm.

A fixing substrate 106 is then joined by a second adhesive layer 107. (See FIG. 2A.) Note that, although the fixing substrate 106 is used here in order to protect the EL elements from the incursion of contaminants such as moisture and oxygen from the outside, it is not in particular necessary to use a fixing substrate. A resin substrate having transparency may be used as the fixing substrate 106, and a substrate having a DLC (diamond-like carbon) film formed as a protective film on one or both surfaces may also be used.

The substrate holder is next removed from the rear surface side using mechanical means, for example by removing the fixing portion 103. In particular, separation is easy because an adhesive is not used. A method for separating the substrate holder in which the fixing portion is separated, and a method for separating the holder by shooting a jet of a fluid (a liquid or a gas under applied pressure) between the substrate holder and the metallic substrate, may also be used. The edge portions of the substrate holder and the metallic substrate are cut apart here, separating the substrate holder and the metallic substrate. (See FIG. 2B.)

A light emitting device sandwiched by the element substrate (the thin metallic substrate 108) and by the fixing substrate (the resin substrate) is then complete.

Figure 2A:
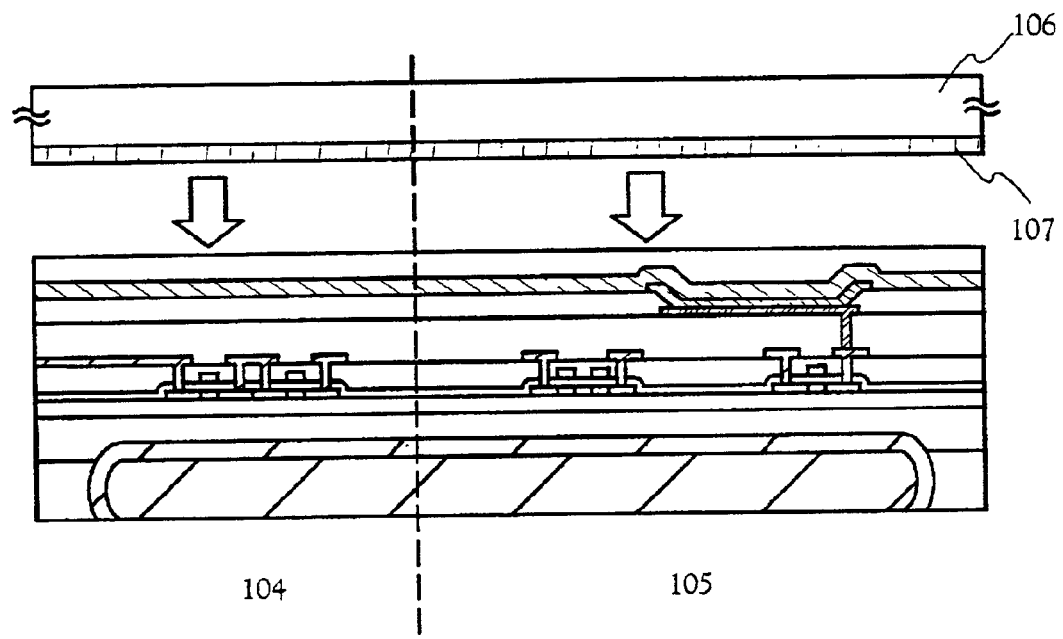
FIGS. 2A and 2B are diagrams showing a process of manufacture of the present invention.
Figure 2B:
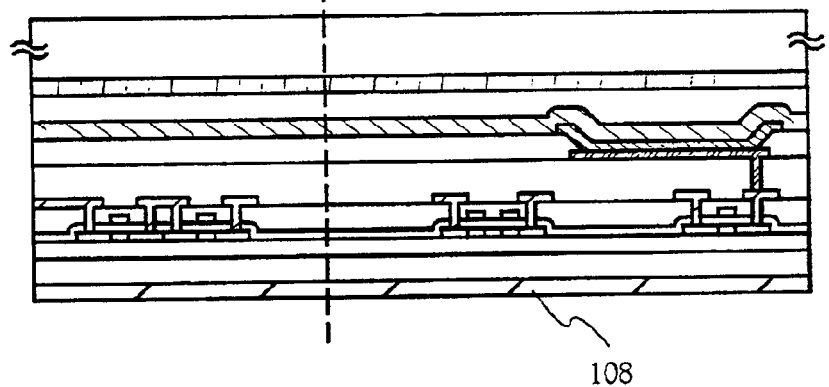

Note that in FIGS. 1A to 1C, and in FIGS. 2A and 2B, the edge portions of the substrate holder and TFT elements are shows as not being separated by much in order to simplify the drawings, but in practice it is preferable to separate them by a sufficient distance.

An additionally detailed explanation of the present invention, having the above structure, is performed by the embodiments shown below.

[Embodiment 1]

An example of a method of manufacturing a light emitting device sandwiched by an element substrate made from a thin metallic substrate, and by a fixing substrate made from a resin substrate, is shown in embodiment 1 using FIGS. 1A to 1C, and FIGS. 2A and 2B. Note that the present invention is of course not limited by the structure shown in embodiment 1.

First, a stainless steel substrate (JIS SUS304 or JIS SUS316) is used as the substrate holder 101. The substrate holder 101 and the element forming substrate 102, made from a thin metallic substrate (JIS SUS304 or JIS SUS316), are then fixed together by the fixing portion 103. (See FIG. 1B.)

After next forming a base insulating film on the metallic substrate 102, necessary elements are formed on the base insulating film. An example in which the driver circuit 104 and the pixel portion 105 having EL elements are formed is shown here. (See FIG. 1C.)

A silicon oxide film, a silicon nitride film, a silicon nitride oxide film (SiOxNy), or a lamination film of these films, having a thickness in a range from 100 to 500 nm can be used as the base insulating film. A known film formation method (such as thermal CVD, plasma CVD, evaporation, sputtering, and reduced pressure thermal CVD) is used as formation means. A lamination film is formed here from: a silicon nitride oxide film containing more nitrogen elements than oxygen elements in the film constitution; and a silicon nitride oxide film containing more oxygen elements than nitrogen elements in the film constitution.

A semiconductor layer is formed next on the base insulating film. There are no limitation to the semiconductor layer material, but it is preferable to form the semiconductor layer by silicon or a silicon germanium alloy ($Si_xGe_{1-x}$, where $0<x<1$). A known method (such as thermal CVD, plasma CVD, evaporation, sputtering, and reduced pressure thermal CVD) can be used as formation means, and a known method (such as solid phase growth, laser crystallization, and solid phase growth using a catalytic element) can also be used as a method of crystallization. An amorphous silicon film is formed using sputtering, which is capable of low temperature film formation, and a crystalline silicon film is formed by laser crystallization. A pulse emission or continuous light emitting excimer laser or YAG laser, and a $YVO_4$ laser can be used for cases in which the crystalline semiconductor film is manufactured by laser crystallization.

A gate insulating film which covers the semiconductor layer is then formed by a known method (such as thermal CVD, plasma CVD, evaporation, and reduced pressure thermal CVD). A silicon oxide film is formed using plasma CVD in embodiment 1.

A conductive layer is formed next on the gate insulating film. After forming the conductive layer by a known means (such as thermal CVD, plasma CVD, reduced pressure thermal CVD, evaporation, and sputtering), it is patterned into a desired shape using a mask.

Impurity regions for forming LDD regions, source regions, or drain regions are formed next by adding a suitable amount of an impurity element which imparts n-type conductivity, or an impurity element which imparts p-type conductivity, to the semiconductor layer using ion injection or ion doping.

An interlayer insulating film is formed next from a silicon nitride film, a silicon oxide nitride film, or a silicon oxide film by a known method (such as thermal CVD, plasma CVD, evaporation, sputtering, and reduced pressure thermal CVD). Further, a process for activating the added impurity elements is performed. Irradiation of laser light is performed here. Activation may also be performed by heat treatment as a substitute for laser light irradiation.

Next, after forming contact holes to reach the source regions or the drain regions using a known technique, source electrodes or drain electrodes are formed, and TFTs are obtained.

Hydrogenation processing is performed next using a known technique, the entire substrate is hydrogenated, and n-channel TFTs and p-channel TFTs are completed. Hydrogenation processing is performed in embodiment 1 using a hydrogen plasma, which is capable of performing hydrogenation at a relatively low temperature.

An interlayer insulating film is formed next from a silicon nitride film, a silicon oxide nitride film, or a silicon oxide film by a known method (such as thermal CVD, plasma CVD, evaporation, sputtering, and reduced pressure thermal CVD). After then forming contact holes for reaching drain electrodes of the pixel portion using a known technique, pixel electrodes (cathodes) are formed. Banks are then formed on both sides of the pixel electrodes, and EL layers and EL element anodes are formed on the pixel electrodes.

All of the elements contained in the pixel portion and the driver circuit are then covered by an insulating film.

The insulating film covering all of the elements formed on the element formation substrate and the fixing substrate 106 are then joined by the second adhesive layer 107. (See FIG. 2A.) Note that although the fixing substrate 106 is used here in order to protect the EL elements from incursion of impurities such as moisture and oxygen, it need not be used when unnecessary. A resin substrate may be used as the fixing substrate 106, and a DLC film may be formed on one or both of the resin substrate surfaces as a protecting film.

The substrate holder is removed next from the rear surface side using mechanical means, for example by removing the fixing portion 103. In particular, the substrate holder is easily separated because an adhesive is not used. The substrate holder and the metallic substrate are separated here by curring off the edge portions of the substrate holder and the metallic substrate. (See FIG. 2B.)

The light emitting device sandwiched by the element substrate made from the thin metallic substrate, and by the fixing substrate made from the resin substrate is thus completed.

[Embodiment 2]

Figure 3A:
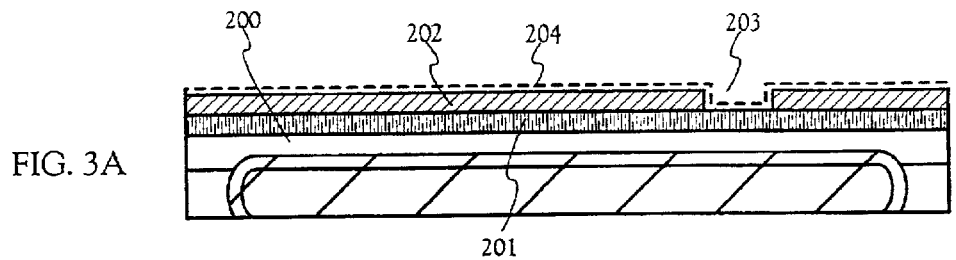
FIGS. 3A to 3C are diagrams for explaining a method of manufacturing a crystalline semiconductor film of Embodiment 2.
Figure 3B:
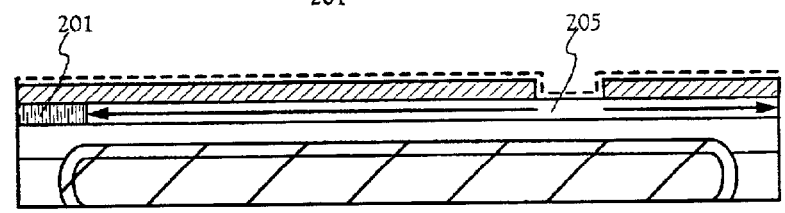
Figure 3C:
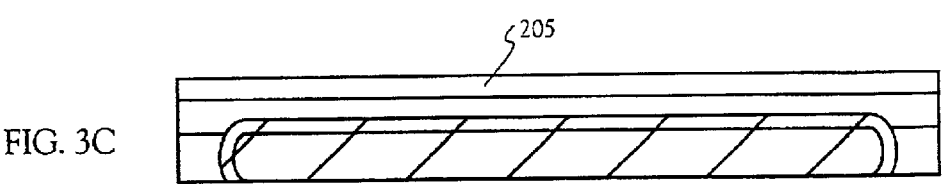

A method of selectively forming a crystalline semiconductor film using a metallic element for promoting crystallization of an amorphous semiconductor film is explained using FIGS. 3A to 3C. Reference numeral 200 denotes a base insulating film, as discussed above, in FIG. 3A.

First, a metallic substrate and a substrate holder are fixed by a fixing portion in accordance with the method shown in the embodiment mode, and the base film 200 is formed thereon. An amorphous silicon film 201 is then formed on the base insulating film 200 by a known method. A 150 nm thick silicon oxide film 202 is then formed on the amorphous silicon film 201. No limitations are placed on the method of manufacturing the silicon oxide film, and it may be formed, for example, by high frequency (13.56 MHz) emission with a power density of 0.5 to 0.8 W/cm$^2$ using a mixture of tetraethyl orthosilicate (TEOS) and $O_2$, and at a reaction pressure of 40 Pa and a substrate temperature of 300 to 400° C.

An opening portion 203 is formed next in the silicon oxide film 202, and a nickel acetate salt solution containing 10 ppm by weight nickel is applied. A nickel containing layer 204 is thus formed, and the nickel containing layer 204 contacts the amorphous silicon film 201 only at the bottom portion of the opening portion 203.

Crystallization is achieved by performing heat treatment at a heat treatment temperature of 500 to 650° C. for between 4 and 24 hours, for example at 570° C. for 14 hours. Portions of the amorphous silicon film contacted by nickel are crystallized first, and crystallization then proceeds in directions parallel to the surface of the substrate. Rod shaped and needle shaped crystals aggregate in a crystalline silicon film 205 thus formed, and each of the crystals is seen to grow while possessing a specific directionality when viewed macroscopically. The crystalline silicon film 205 can then be obtained by removing the silicon oxide film 202.

Note that it is possible to combine embodiment 2 with embodiment 1.

[Embodiment 3]

Metallic elements utilized in crystallization of a crystalline silicon film manufactured by performing the processes explained by embodiment 2 remain after manufacture. Even if the metallic elements are not distributed evenly within the film, they exist at a concentration exceeding $1\times10^{19}/cm^3$ when taking an average concentration. It is of course possible to use the crystalline semiconductor film in channel forming regions for all types of semiconductor devices such as TFTs, in this state, but it is very preferable to remove the metallic elements by gettering.

Figure 4A:
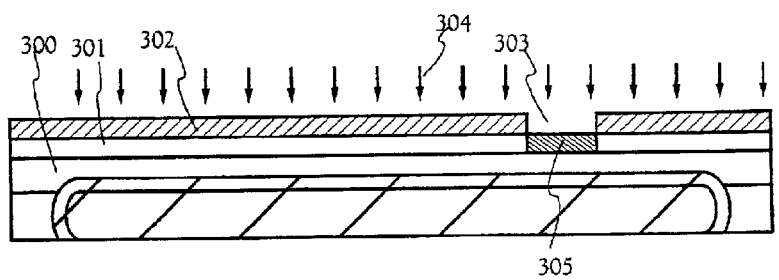
FIGS. 4A to 4C are diagrams for explaining a method of manufacturing a crystalline semiconductor film of Embodiment 3.
Figure 4B:
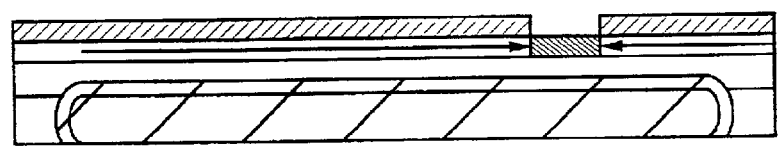
Figure 4C:
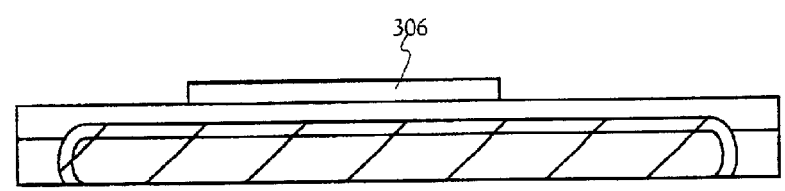

An example of a gettering process is explained using FIGS. 4A to 4C. A silicon oxide film mask 302 having a thickness of 150 nm is formed on the surface of a crystalline silicon film 301, an opening portion 303 is formed, and a region in which the crystalline silicon film is exposed is formed. It is possible to utilize the silicon oxide film 202 shown by FIG. 3A as is for a case in which embodiment 2 is followed, and it is also possible to switch over to the processes of embodiment 3 as is after the process step of FIG. 3B. Phosphorus is then added by ion doping, forming a phosphorus added region 305 having a concentration of $1\times10^{19}$ to $1\times10^{22}/cm^3$ of phosphorus.

If heat treatment is then performed as shown in FIG. 4B within a nitrogen atmosphere at for 5 to 24 hours at 550 to 800° C., for example, for 12 hours at 600° C., the phosphorus added region 305 works as a gettering site, and catalytic elements remaining in the crystalline silicon film 301 can be segregated to the phosphorus added region 305.

By next removing the silicon oxide film mask 302 and the phosphorus added region 305 by etching, as shown by FIG. 4C, a crystalline silicon film 306, in which the concentration of the metallic element used by the crystallization process is reduced to less than $1\times10^{17}/cm^3$, can be obtained.

Note that it is possible to combine embodiment 3 with embodiment 1 and embodiment 2.

[Embodiment 4]

An example of manufacturing a CMOS circuit in which an n-channel TFT 540 and a p-channel TFT 541 are combined in compliment is explained in embodiment 4 using FIGS. 5A to 5D, and FIGS. 6A to 6D.

Semiconductor layers 501 and 502 are formed after forming a base insulating film 404 on a metallic substrate 402 fixed to a substrate holder 401 by a fixing portion 403 in accordance with the embodiment mode. (See FIG. 5A.)

Next, a gate insulating film 503, a first conductive film 504, and a second conductive film 505 are formed. (See FIG. 5B.) The first conductive film 503 and the second conductive film 504 may both also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polysilicon film, into which an impurity element such as phosphorus is doped may also be used. In this embodiment, the first conductive film 504 is formed having a thickness of 50 to 100 nm from tantalum nitride or from titanium, and the second conductive film 505 is formed by tungsten with a thickness between 100 and 300 nm.

Figure 5A:
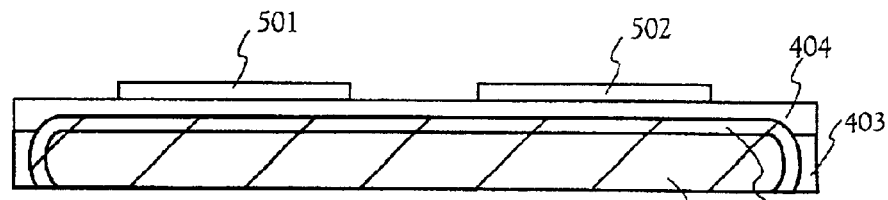
FIGS. 5A to 5D are diagrams for explaining a process of manufacturing a CMOS circuit of Embodiment 4.
Figure 5B:
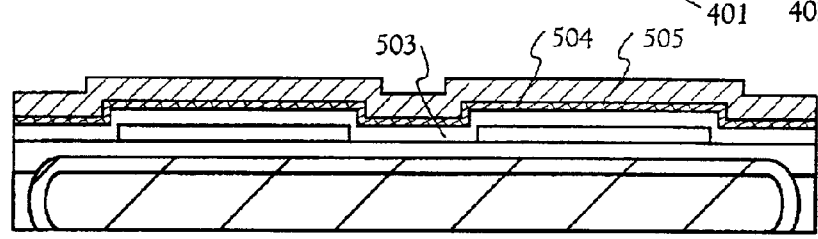
Figure 5C:
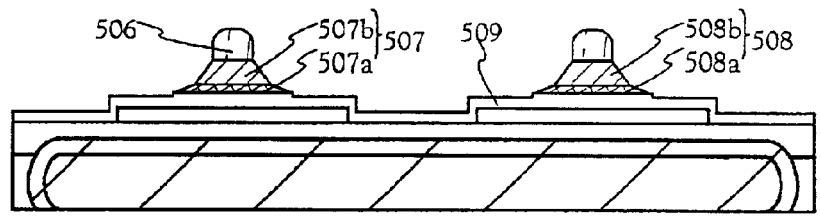
Figure 5D:
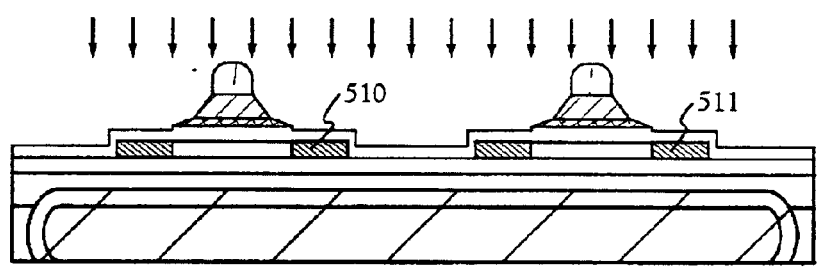

A mask 506 is formed next, and a first etching process is performed in order to form gate electrodes, as shown in FIG. 5C. There are no limitations placed on the etching method, but IPC (inductively coupled plasma) etching is preferably used. A gas mixture of $CF_4$ and $Cl_2$ is used as an etching gas, and a plasma is generated by applying a 500 W RF electric power (13.56 MHz) to a coil shape electrode at 0.5–2 Pa, preferably, 1 Pa. A 100 W RF electric power (13.56 MHz)

is also applied to the substrate side (sample stage), effectively applying a negative self-bias. Tungsten films, tantalum nitride films, and titanium films all have etching rates which are on the same order when $CF_4$ and $Cl_2$ are combined.

Edge portions can be made into tapered shapes under the above etching conditions due to the shape of the resist mask and due to the effect of the bias voltage applied to the substrate. The angle of the tapered portions is set to be from 15 to 45°. Further, the etching time may be increased by approximately 10 to 20% in order to perform etching without any residue remaining on the gate insulating film. The selectivity of a silicon nitride oxide film with respect to a W film is from 2 to 4 (typically 3), and therefore approximately 20 to 50 nm of the exposed surface of the silicon nitride oxide film is etched by this over-etching process. First shape conductive layers 507 and 508 (first conductive layers 507a and 508a, and second conductive layers 507b and 508b) are thus formed from the first conductive film and the second conductive film by the first etching process. Reference numeral 509 denotes a gate insulating film, and the gate insulating film becomes thinner due to the etching by approximately 20 to 50 nm in regions not covered by the first shape conductive layers.

A first doping process is then performed, and an n-type impurity (donor) is doped. (See FIG. 5D.) Ion doping or ion implantation is performed for the first doping process. Ion doping is performed with conditions of a dosage of $1 \times 10^{13}$ to $5 \times 10^{14}/cm^2$. An element residing in group 15 of the periodic table, typically phosphorus (P) or arsenic (As), is used as an impurity element which imparts n-type conductivity. In this case, the first shape conductive layers 507 and 508 become masks with respect to the element being doped. The acceleration voltage is suitably regulated (for example, from 20 to 60 keV), and impurity regions (n+ regions) 510 and 511 are formed by the impurity elements passing through the gate insulating film 509. For example, the phosphorus (P) concentration in the impurity regions is set so as to become within a range of $1 \times 10^{20}$ to $1 \times 10^{21}/cm^3$.

Figure 6A:
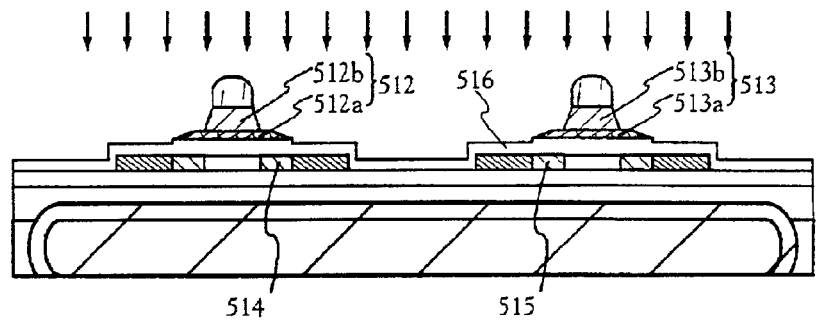
FIGS. 6A to 6D are diagrams for explaining a process of manufacturing a CMOS circuit of Embodiment 5.

In addition, a second etching process is performed as shown in FIG. 6A. An ICP etching method is used, a mixture of $CF_4$, $Cl_2$, and $O_2$ is used as an etching gas, and a plasma is generated by supplying a 500 W RF electric power (13.56 MHz) to a coil shape electrode at a pressure of 1 Pa. A 50 W RF (13.56 MHz) electric power is applied to the substrate side (sample stage), and a self-bias voltage which is lower in comparison to that of the first etching process is applied. The tungsten film is etched anisotropically under these etching conditions, and the first conductive layers made from a tantalum nitride film or from a titanium film are made to remain. Second shape conductive layers 512 and 513 (first conductive films 512a and 513a, and second conductive films 512b and 513b) are thus formed. Reference numeral 516 denotes a gate insulating film, and the gate insulating film is additionally etched on the order of 20 to 50 nm in regions not covered by the second shape conductive layers 512 and 513, becoming thinner.

Figure 6B:
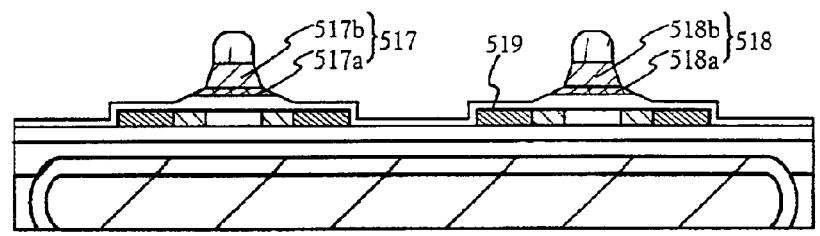
Figure 6C:
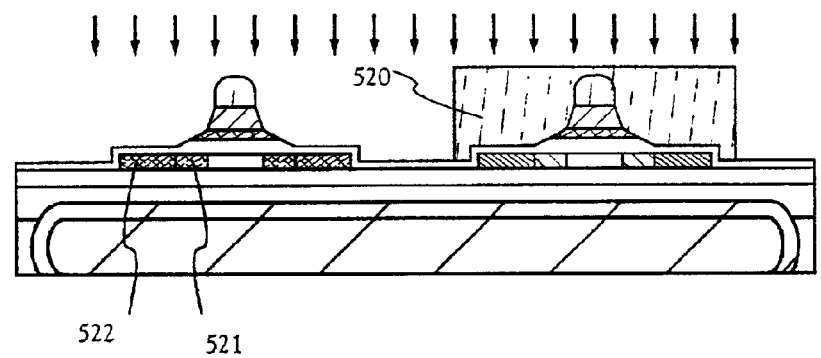

A second doping process is then performed as shown in FIG. 6C. Under conditions of a dosage reduced to less than that of the first doping process, and a high acceleration voltage, an n-type impurity (donor) is doped. Doping is performed, for example, with an acceleration voltage of 70 to 120 keV and a dosage of $1 \times 10^{13}/cm^2$, forming impurity region on the inside of the first impurity regions formed in the semiconductor layers. The second conductive layers 512b and 513b are used as masks with respect to the impurity elements, and the impurity elements are doped so as to be added to the bottom side of the first conductive films 512a and 513a. Impurity regions (n− regions) 514 and 515 which overlap with the first conductive films 512a and 513a are thus formed. The concentration difference in a direction across the second conductive layers is small because the second conductive layers 512a and 513a remain with nearly the same film thicknesses, and the impurity regions are formed at a concentration of $1 \times 10^{17}$ to $1 \times 10^{19}/cm^3$.

A third etching process is then performed as shown in FIG. 6B, and etching of the gate insulating film 516 is performed. As a result, the second conductive film is also etched, and its edge portions retreat, becoming smaller, and forming third shape conductive layers 517 and 518. Reference numeral 519 within the figures denotes the gate insulating film which remains.

A mask 520 is then formed from resist, as shown in FIG. 6C, and a p-type impurity (acceptor) is doped into the semiconductor layer 501 which forms a p-channel TFT. Boron (B) is typically used. The impurity concentration of impurity regions (p+ regions) 521 and 522 is made to become from $2 \times 10^{20}$ to $2 \times 10^{21}/cm^3$. Boron is added at a concentration of 1.5 to 3 times that of the phosphorus contained inside, and the conductivity type is made to invert.

Figure 6D:
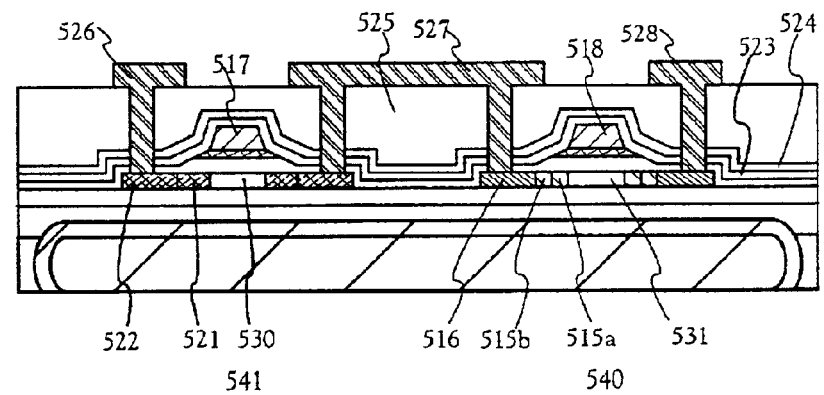

Impurity regions are formed in each of the semiconductor layers by the processes up through here. The third shape conductive layers 517 and 518 become gate electrodes. Next, as shown in FIG. 6D, a protective insulating film 523 made from a silicon nitride film or from a silicon nitride oxide film is formed by plasma CVD. A process for activating the impurity elements added to each of the semiconductor layers with a goal of controlling the conductivity type is then performed.

In addition, a silicon nitride film 524 is formed, and a hydrogenation process is performed. As a result, hydrogenation can be achieved by the diffusion throughout the semiconductor layers of hydrogen from within the silicon nitride film.

An interlayer insulating film 525 is formed by an organic insulating material, such as polyimide and acrylic. A silicon oxide film formed by plasma CVD using TEOS (tetraethyl orthosilicate) may also be applied, or course, but it is preferable to use the organic material in consideration of increasing levelness.

Contact holes are formed next, and source wirings and drain wirings 526 to 528 are formed using materials such as aluminum (Al), titanium (Ti), and tantalum (Ta).

The CMOS circuit, in which the n-channel TFT 540 and the p-channel TFT 541 are combined in compliment, can be obtained by the above processes.

The p-channel TFT 541 has a channel forming region 530, and the impurity regions 521 and 522 which function as source regions or drain regions.

The n-channel TFT 540 has a channel forming region 531, the impurity region 515a (gate overlapped drain: GOLD region) which overlaps with the gate electrode 518 made from the third shape conductive layer, the impurity region 515b (LDD region) formed on the outside of the gate electrode, and the impurity region 516 which functions as a source region or a drain region.

It is possible to form a driver circuit of an active matrix EL display device with this type of CMOS circuit. These types of n-channel TFTs and p-channel TFTs can also be applied to transistors formed in a pixel portion.

Basic logic circuits can be structured by combining CMOS circuits of this type, and in addition, complex logic circuits (such as signal partitioning circuits, D/A converters, operational amplifiers, and γ-compensation circuits) can also be structured. In addition, it is possible to form memory and microprocessors with these CMOS circuits.

Further, it is possible to freely combine embodiment 4 with any one of embodiments 1 to 3.

[Embodiment 5]

An example of manufacturing an EL (electroluminescence) display device using TFTs obtained by embodiment 4 is explained below using FIG. 7 and FIGS. 8A and 8B.

Figure 7:
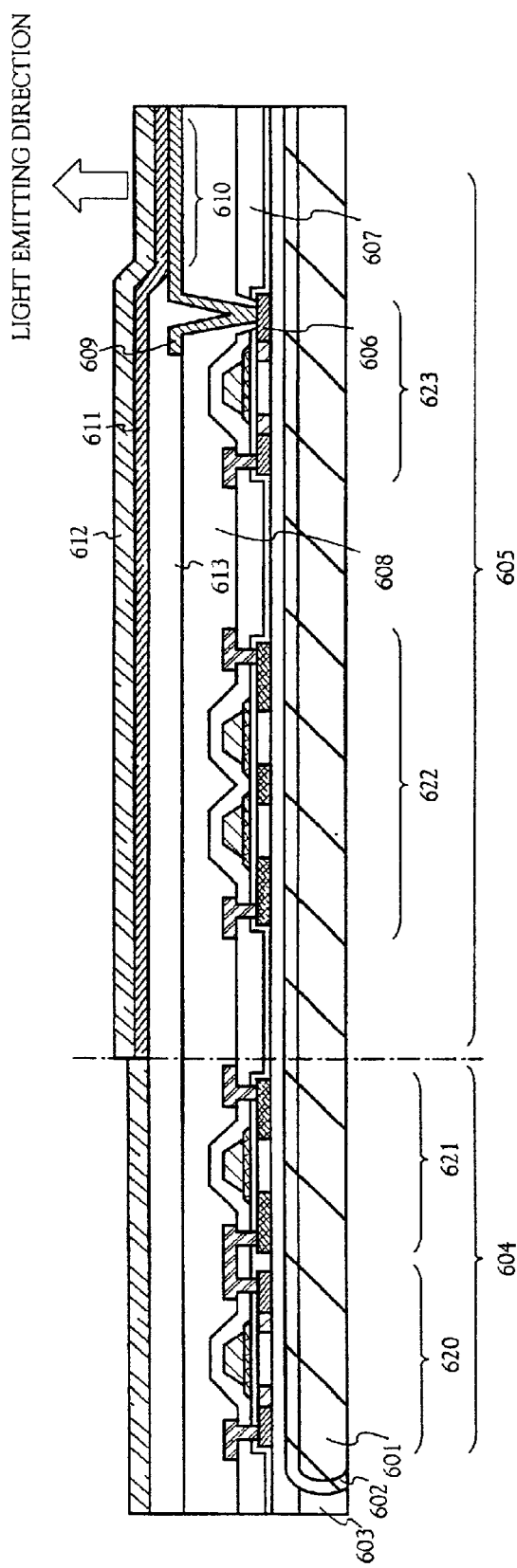
FIG. 7 is a cross sectional structure diagram of a driver circuit and a pixel portion of an EL display device of Embodiment 5.

An example of a light emitting device having a pixel portion 605, and a driver circuit 604 for driving the pixel portion, formed on the same insulating body (in a state before sealing) is shown in FIG. 7. Note that a CMOS circuit, a basic unit, is shown in the driver circuit, and one pixel is shown in the pixel portion. This CMOS circuit can be obtained in accordance with embodiment 4.

Reference numeral 601 denotes a substrate holder in FIG. 7, reference numeral 603 denotes a fixing portion, and reference numeral 602 denotes an element formation substrate (thin metallic substrate). A driver circuit 604 composed of an n-channel TFT 620 and a p-channel TFT 621, a switching TFT 622 made from a p-channel TFT, and an electric current control TFT 623 made from an n-channel TFT are formed on a base insulating film formed on the element formation substrate. Further, all of the TFTs are formed by top gate TFTs in embodiment 5.

Embodiment 4 may be referred to for an explanation of the n-channel TFTs and the p-channel TFTs, and therefore such explanation is omitted here. Further, the switching TFT is a p-channel TFT with a structure having two channel forming regions between a source region and a drain region (double gate structure). Note that there are no limitations placed on embodiment 4 by the double gate structure, and a single gate structure in which one channel forming region is formed, and a triple gate structure in which three channel forming regions are formed, may also be used.

Further, a contact hole is formed in a first interlayer insulating film 607 before forming a second interlayer insulating film 608 over a drain region 606 of the electric current control TFT. This is in order to simplify the etching process when forming a contact hole in the second interlayer insulating film 608. A contact holes is formed in the second interlayer insulating film 608 in order to reach the drain region 606, and a pixel electrode 609 is formed connected to the drain region 606. The pixel electrode 609 is an electrode which functions as a cathode of an EL element, and the pixel electrode is formed using a conductive film containing a periodic table group 1 or group 2 element. A conductive film made from a chemical compound of lithium and aluminum is used in embodiment 5.

Next, reference numeral 613 denotes an insulating film formed so as to cover edge portions of the pixel electrode 609, and is referred to as a bank throughout this specification. The bank 613 may be formed by an insulating film containing silicon or by a resin film. If a resin film is used, damage to the insulator at the time of film formation can be suppressed if carbon particles or metallic particles are added so that the resistivity of the resin film becomes from $1\times10^6$ to $1\times10^{12}$ $\Omega m$ (preferably between $1\times10^8$ and $1\times10^{10}$ $\Omega m$).

Further, an EL element 610 is made from the pixel electrode (cathode) 609, an EL layer 611, and an anode 612. A conductive film having a large work coefficient, typically an oxide conductive film, is used for the anode 612. Indium oxide, tin oxide, zinc oxide, or a chemical compound of these materials may be used as the oxide conductive film.

Note that the term EL layer is defined throughout this specification as a generic term for a layer in which a hole injecting layer, a hole transporting layer, a hole preventing layer, an electron transporting layer, an electron injecting layer, or an electron preventing layer are combined and laminated with respect to a light emitting layer (EL film). Note also that the term EL layer also includes a case in which an EL film is used as a single layer.

Further, there are no specific limitations placed on the light emitting layer provided that it is a low molecular type or polymer EL material, and a thin film made from a light emitting material in which light is emitted by singlet excitation, and a thin film made from a light emitting material in which light is emitted by triplet excitation can be used, for example.

Note that, although not shown in the figures, it is effective to form a passivation film so as to completely cover the EL element 610 after forming the anode 612. The passivation film is made from an insulating film such as a carbon film (typically a DLC film), a silicon nitride film, and a silicon oxide nitride film, and the insulating films may be used in single layers or in a lamination of a combination of the insulating films.

The substrate holder 601 is then separated as shown in the embodiment mode and in embodiment 1, after performing up through a process of sealing (or enclosing) in order to protect the EL element. FIGS. 8A and 8B are used for further explanation of the EL display device.

Figure 8A:
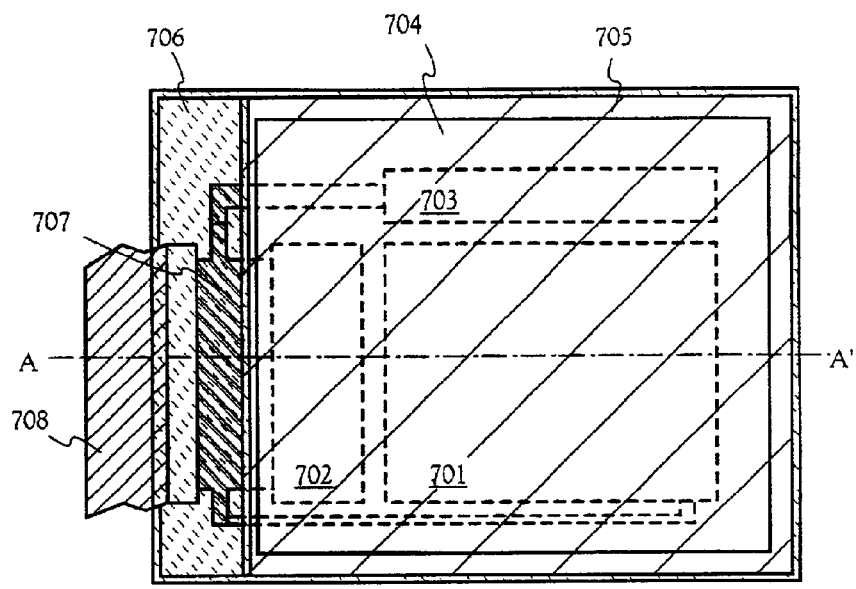
FIGS. 8A and 8B are a top surface diagram and a cross sectional diagram, respectively, of an EL display device of Embodiment 5.
Figure 8B:
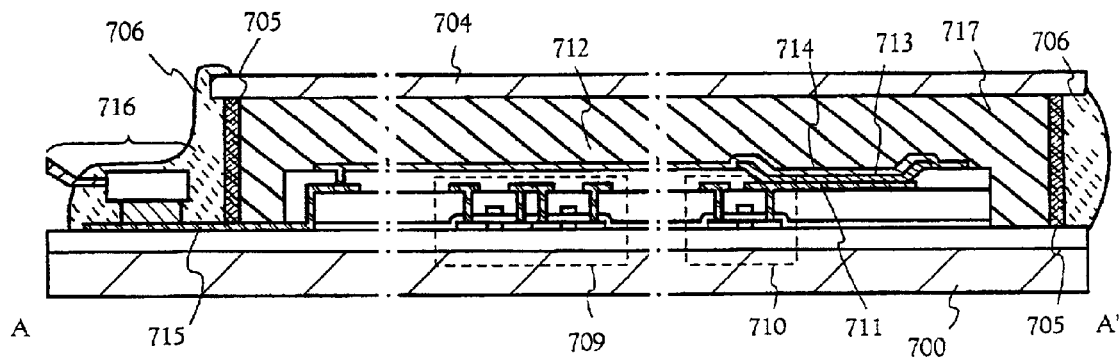

FIG. 8A is a top surface diagram showing a state in which processes up through the sealing of the EL element have been performed, and FIG. 8B is a cross sectional diagram of FIG. 8A taken along the line segment A–A'. Reference numeral 701 shown by a dotted line denotes a pixel portion, reference numeral 702 denotes a source side driver circuit, and reference numeral 703 denotes a gate side driver circuit. Further, reference numeral 704 denotes a cover material, reference numeral 705 denotes a first sealing material, and reference numeral 706 denotes a second sealing material.

Note that reference numeral 708 denote wirings for transmitting signals input to the source side driver circuit 702 and the gate side driver circuit 703, and that video signals and clock signals are received from an FPC (flexible printed circuit) 708, which becomes an external input terminal. Note also that, although only the FPC is shown in the figures, a printed wiring board (PWB) may also be attached to the FPC.

The cross sectional structure is explained next using FIG. 8B. The pixel portion and a source side driver circuit 709 are formed on an insulating body 700 (corresponding to the element formation substrate 603), and a plurality of pixels containing an electric current control TFT 710 and a pixel electrode 711 electrically connected to the drain of the electric current control TFT 710 are formed in the pixel portion. Further, the source side driver circuit 709 is formed using CMOS circuits in which n-channel TFTs and p-channel TFTs are combined.

Banks 712 are formed on both ends of the pixel electrode 711, and an EL layer 713 and an EL element cathode 714 are formed on the pixel electrode 711. An anode 714 also functions as a common wiring for all pixels, and is electrically connected to an FPC 716 through a connection wiring 715. In addition, all elements included in the pixel portion and the source side driver circuit 709 are covered by a passivation film (not shown in the figures).

The cover material 704 is bonded by the first sealing material 705. Note that spacers may also be formed in order to ensure the spacing between the cover material 704 and the EL elements. An aperture 717 is formed on the inside of the first sealing material 705. Note that it is preferable that the first sealing material 705 be a material through which moisture and oxygen do not pass. In addition, it is effective to form a substance possessing a moisture absorbing effect and an oxidation preventative effect on the inside of the aperture 717.

Note that a carbon film (specifically, a diamond like carbon (DLC) film) may be formed having a thickness of 2 to 30 nm on the front surface and the rear surface of the covering material 704 as a protective film. This type of carbon film (not shown in the figures here) possesses a role of preventing the incursion of oxygen and moisture, and also mechanically protecting the front surface of the covering material. Further, a polarizing plate (typically a circular polarizing plate) may also be attached to the covering material 704.

After bonding the covering material 704, the second sealing material 706 is formed so as to cover the exposed surface of the first sealing material 705. The same material as that of the first sealing material 705 can be used for the second sealing material 706.

The EL elements can be completely cutoff from the outside by sealing the EL elements with the above structure, and substances from the outside, such as moisture and oxygen, which promote degradation due to oxidation of the EL layer can be prevented from penetrating. An EL display device having high reliability can therefore be obtained.

Furthermore, it is possible to combine embodiment 5 with embodiment 1.

[Embodiment 6]

Figure 9A:
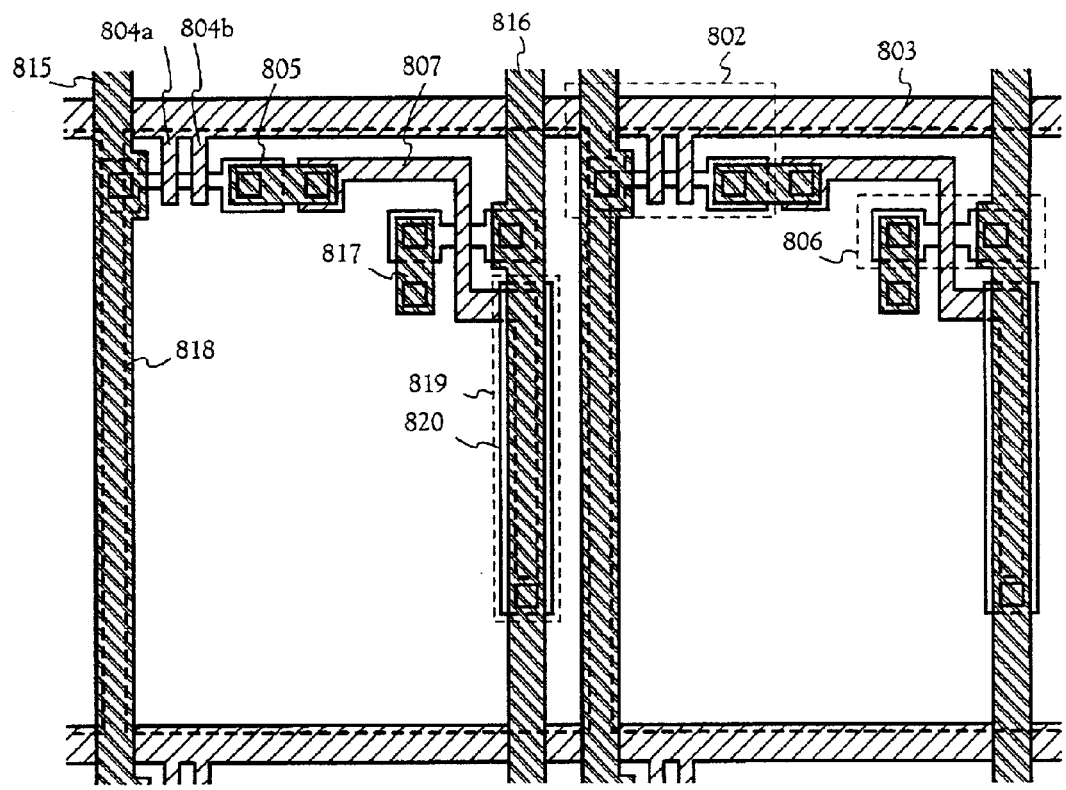
FIGS. 9A and 9B are a top surface diagram and a circuit diagram, respectively, of an EL display device pixel of Embodiment 6.
Figure 9B:
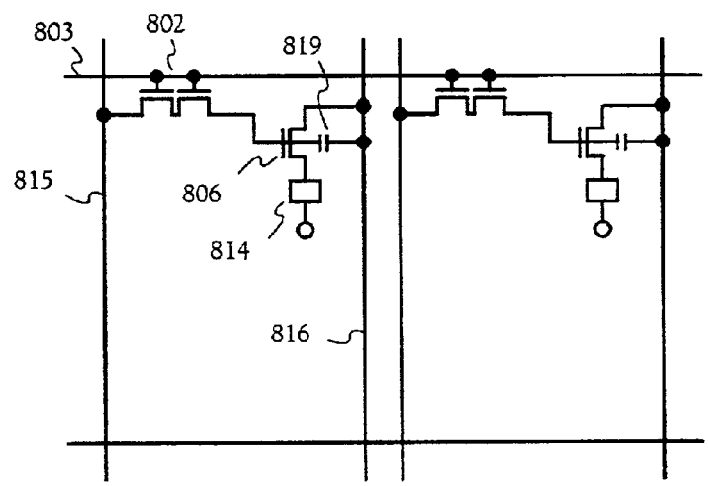

A more detailed top surface structure of a pixel portion in the EL display device obtained by embodiment 5 is shown in FIG. 9A, and a circuit diagram is shown in FIG. 9B in embodiment 6. Common reference numerals are used in FIGS. 9A and 9B, and therefore the figures may be mutually referenced.

A source of a switching TFT 802 is connected to a source wiring 815, and a drain of the switching TFT 802 is connected to a drain wiring 805. Further, the drain wiring 805 is electrically connected to a gate electrode 807 of an electric current control TFT 806. A source of the electric current control TFT 806 is electrically connected to an electric current supply time 816, while a drain of the electric current control TFT 806 is electrically connected to a drain wiring 817. The drain wiring 817 is electrically connected to a pixel electrode (cathode) 818 denoted by a dotted line.

A storage capacitor is formed in a region denoted by reference numeral 819 at this point. The storage capacitor 819 is formed between a semiconductor film 820 electrically connected to the electric current supply line 816, an insulating film (not shown in the figures) of the same layer as a gate insulating film, and the gate electrode 807. Further, it is possible to use a capacitance formed by the gate electrode 807, a layer (not shown in the figures) which is the same as a first interlayer insulating film, and the electric current supply line 816 as a storage capacitor.

It is possible to combine embodiment 6 with embodiment 1 or embodiment 5.

[Embodiment 7]

Figure 10:
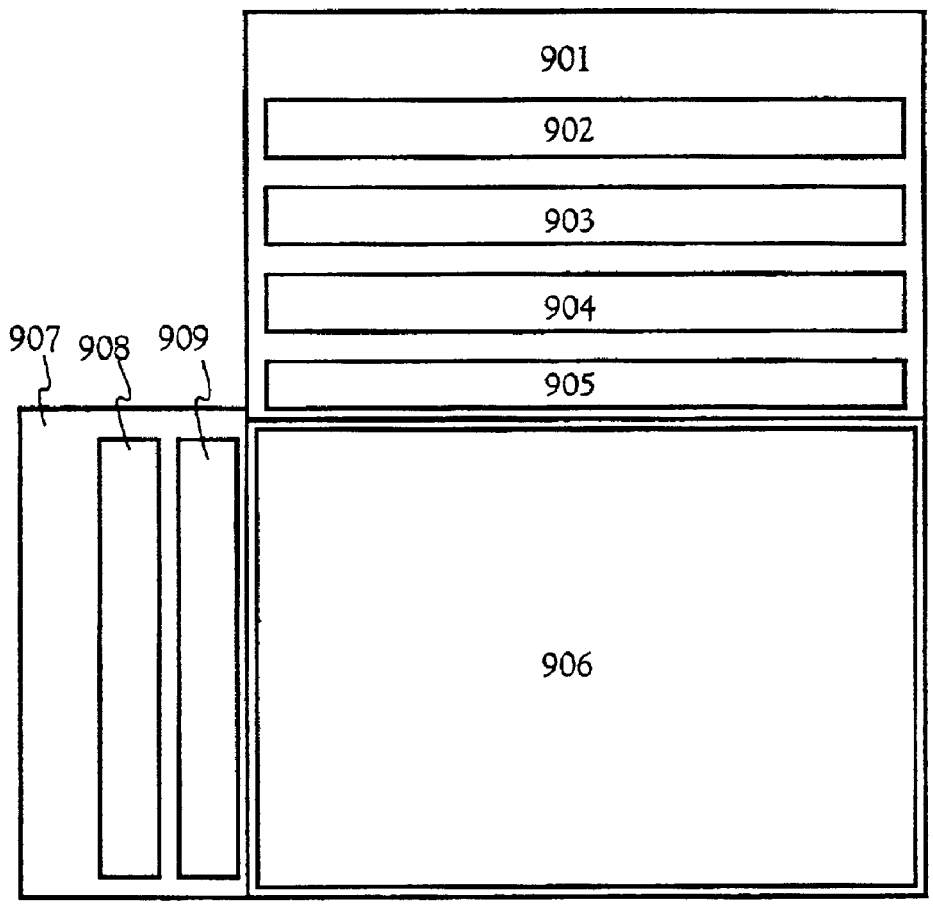
FIG. 10 is a circuit block diagram of a digital drive EL display device of Embodiment 7.

An example of a circuit structure of the EL display device shown in embodiment 5 or embodiment 6 is shown in FIG. 10. Note that a circuit structure for performing digital drive is shown in embodiment 7. A source side driver circuit 901, a pixel portion 906, and a gate side driver circuit 907 are present in embodiment 7. Note that the term driver circuit is used as a generic term containing source side processing circuits and gate side driver circuits throughout this specification.

A shift register 902, a latch (A) 903, a latch (B) 904, and a buffer 905 are formed in the source side driver circuit 901. Note that a sampling circuit (transfer gate) may be formed as a substitute for the latch (A) and the latch (B) for a case of analog drive. Further, a shift register 908 and a buffer 909 are formed in the gate side driver circuit 907.

A plurality of pixels are contained in the pixel portion 906 in embodiment 7, and EL elements are formed in each of the plurality of pixels. It is preferable that cathodes of the EL elements be electrically connected to drains of electric current control TFTs.

The source side driver circuit 901 and the gate side driver circuit 907 are formed by using the n-channel TFTs and the p-channel TFTs obtained by embodiments 2 to 4.

Note that, although not shown in the figure, an additional gate side driver circuit may also be formed on the side opposite that of the gate side driver circuit 907, sandwiching the pixel portion 906. Both have the same structure in this case, and gate wirings are shared, and the pixel portion can be made to operate normally by gate signals sent from one of the gate side driver circuits even if the other is damaged.

It is possible to combine embodiment 7 with embodiment 1, embodiment 5, or embodiment 6.

[Embodiment 8]

Figure 11:
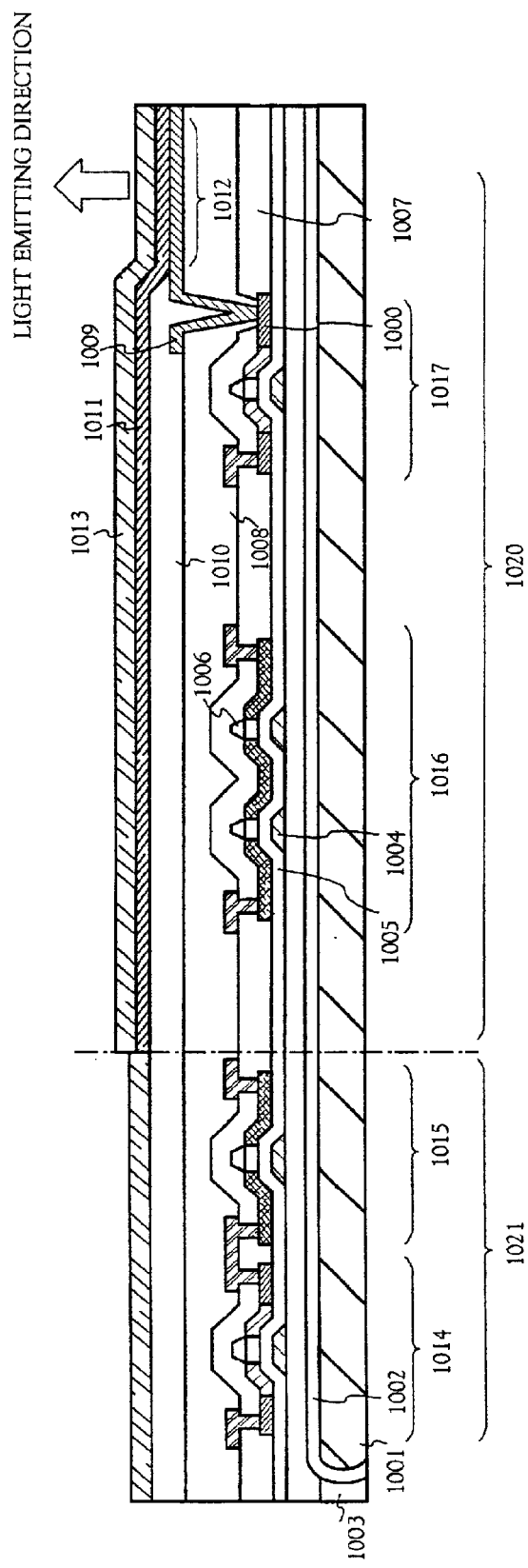
FIG. 11 is a cross sectional structure diagram of a driver circuit and a pixel portion of an EL display device of Embodiment 8.

An example of an EL display device in which all TFTs used in a pixel portion 1020 and in a driver circuit portion 1021 are structured by reverse stagger type TFTs is shown in FIG. 11 in embodiment 8.

Reference numeral 1001 denotes a substrate holder in FIG. 11, reference numeral 1002 denotes a metallic substrate, and reference numeral 1003 denotes a fixing portion. First, a metallic substrate 1002 fixed to the substrate holder 1001 by the fixing portion 1003 is prepared. Next, a base insulating film is formed on the metallic substrate.

A gate wiring (containing a gate electrode) 1004 is formed next on the base insulating film with a single layer structure or a lamination structure. Methods such as thermal CVD, plasma CVD, reduced pressure CVD, evaporation or sputtering may be used as means for forming the gate wiring 1004, and it is formed by a known patterning technique after forming a conductive film having a film thickness in a range of from 10 to 1000 nm, preferably in a range from 30 to 300 nm. Further, as the material of the gate wiring 1004, provided that there is a structure having at least one material layer containing as its main constituent: a material having a conductive material or a semiconductor conductor material as its main constituent; a high melting point metallic material, for example, such as Ta (tantalum), Mo (molybdenum), Ti (titanium), W (tungsten), and chromium (Cr); a silicide compound of these metallic materials with silicon; a material such as polysilicon having n-type or p-type conductivity; or a low resistance metallic material such as Cu (copper) and Al (aluminum), all of these materials can be used without any specific limitations.

A gate insulating film 1005 is formed next.

An amorphous semiconductor film is formed next. A laser crystallization process is performed on the amorphous semiconductor film, and after forming a crystalline semiconductor film, the crystalline semiconductor film obtained is patterned into a desired shape, forming semiconductor layers. An insulating layer 1006 is then formed on the semiconductor layers. The insulating film 1006 protects channel forming regions during processes for adding impurity elements.

Suitable impurity elements which impart n-type conductivity, or impurity elements which impart p-type conductivity, to the semiconductor layers are then added using ion injection or ion doping, forming impurity regions which will form LDD regions, source regions, or drain regions.

An interlayer insulating film is formed next from a silicon nitride film, a silicon oxide nitride film, or a silicon oxide film manufactured by sputtering. Further, a process for activating the added impurity elements is performed. Irradiation of laser light is performed here. Activation may also be performed by heat treatment as a substitute for laser light irradiation.

Next, after forming a contact hole to reach a source region or a drain region using a known technique, a source electrode or a drain electrode is formed, and an inverted stagger TFT is obtained.

Hydrogenation processing is performed using a known technique next, the entire substrate body is hydrogenated, and n-channel TFTs and p-channel TFTs are completed. Hydrogenation processing is performed in embodiment 8 using a hydrogen plasma, which is capable of performing hydrogenation at a relatively low temperature.

A first interlayer insulating film 1007 is formed next from a silicon nitride film, a silicon oxide nitride film, or a silicon oxide film manufactured by sputtering. A contact hole for reaching the drain region 1000 of the pixel portion is then formed using a known technique, after which a second interlayer insulating film 1008 is formed. A contact hole for reaching the drain region 1000 of the pixel portion is then formed using a known technique, after which a pixel electrode 1009 is formed. Banks 1010 are then formed on both ends of the pixel electrode, and an EL layer 1011, and an anode 1013 of an EL element 1012, formed on the pixel electrode.

A driver circuit 1021 composed of an n-channel TFT 1014 and a p-channel TFT 1015, a switching TFT 1016 made from a p-channel TFT, and an electric current control TFT 1017 made from an n-channel TFT are formed on an element formation substrate made from the metallic substrate in FIG. 11. Further, all of the TFTs are formed by reverse stagger TFTs in embodiment 8.

The switching TFT 1016 has a structure (double gate structure) having two channel forming regions between a source region and a drain region. Note that embodiment 8 is not limited to the double gate structure, and a single gate structure in which one channel forming region is formed, and a triple gate structure in which three channel forming regions are formed, may also be used.

In addition, it is preferable to cover all of the elements contained in the pixel portion 1020 and in the driver circuit 1021 by a passivation film (not shown in the figure).

The substrate holder 1001 is separated in accordance with the processes of embodiment 1, and the light emitting device is completed.

Note that it is possible to combine embodiment 8 with embodiment 1, embodiment 6, or embodiment 7.

[Embodiment 9]

Figure 12:
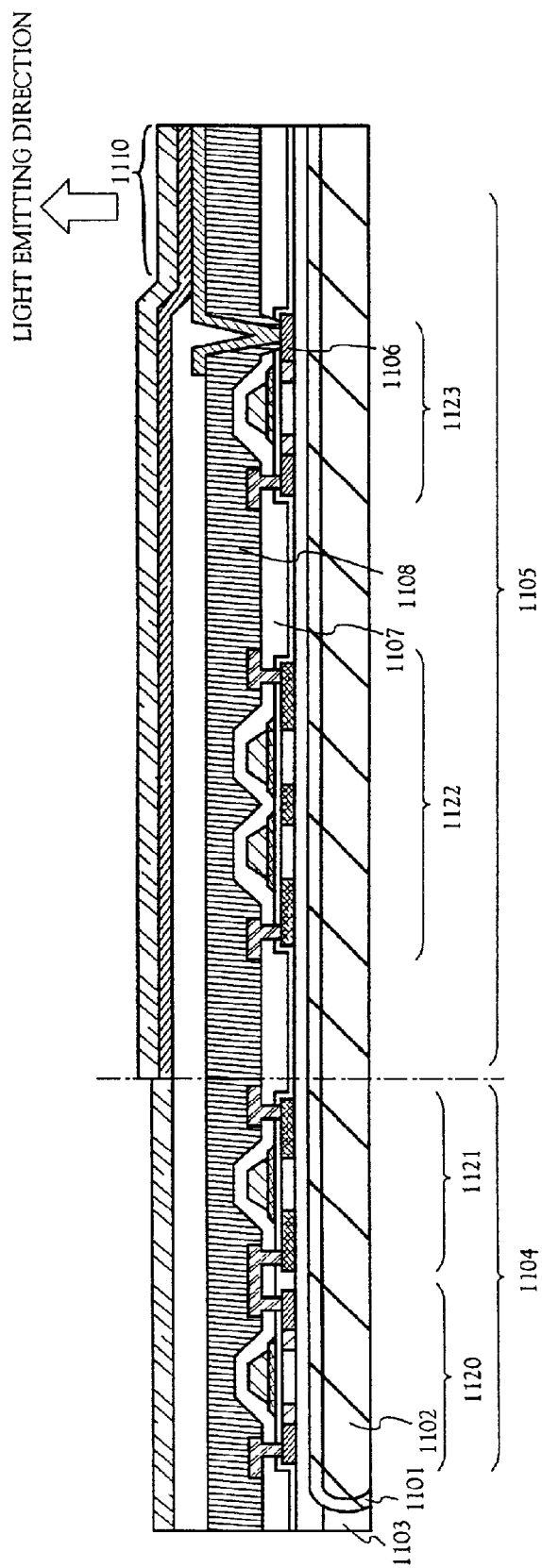
FIG. 12 is a cross sectional structure diagram of a driver circuit and a pixel portion of an EL display device of Embodiment 9.

An example of forming a light shielding film in order to prevent an EL display device from becoming mirrored, without using a circular polarizing film, is shown in FIG. 12 in embodiment 9. Normally, a stainless steel substrate does not easily become mirrored because its reflectivity is low, but it will easily become mirrored for cases in which it is polished in order to make the substrate surface level.

Except for forming a light shielding film 1108 instead of a second interlayer insulating film (reference numeral 608 in FIG. 7), the basic structure is identical to that of embodiment 5, and a detailed description is therefore omitted.

Reference numeral 1102 denotes a substrate holder in FIG. 12, reference numeral 1103 denotes a fixing portion, and reference numeral 1101 denotes an element formation substrate (thin metallic substrate). A driver circuit 1104 composed of an n-channel TFT 1120 and a p-channel TFT 1121, a switching TFT 1122 made from a p-channel TFT, and an electric current control TFT 1123 made from an n-channel TFT are formed on a pixel portion 1105 formed on the element formation substrate. Further, all of the TFTs are formed by top gate TFTs in embodiment 9.

Embodiment 4 may be referred to for an explanation of the n-channel TFTs and the p-channel TFTs, and therefore such explanation is omitted here. Further, the switching TFT is a p-channel TFT with a structure having two channel forming regions between a source region and a drain region (double gate structure). Note that there are no limitations placed on embodiment 9 by the double gate structure, and a single gate structure in which one channel forming region is formed, and a triple gate structure in which three channel forming regions are formed, may also be used.

Further, a contact hole is formed in a first interlayer insulating film 1107 before forming a light shielding film 1108 on a drain region 1106 of the electric current control TFT 1123. This is in order to simplify the etching process when forming a contact hole in the light shielding film 1108. A contact hole is formed in the light shielding film 1108 in order to reach the drain region 1106, and a pixel electrode 1109 is formed connected to the drain region 1106. The pixel electrode 1109 is an electrode which functions as a cathode of an EL element, and the pixel electrode is formed using a conductive film containing a periodic table group 1 or group 2 element. A conductive film made from a chemical compound of lithium and aluminum is used in embodiment 9.

A thin film made from a material having a high absorption coefficient with respect to visible light can be used as the light shielding film 1108. Typically, an insulating film (preferably a resin film) in which metallic particles or carbon particles are distributed; a metallic film having a low reflectivity (preferably a titanium film, a titanium nitride film, a chromium film, a molybdenum film, a tungsten film, a tantalum film, or a tantalum nitride film); or a semiconductor film can be used. An insulating film in which carbon particles are distributed is used here.

Further, it is effective to regulate the amount of metallic particles or carbon particles added, or the particle diameter thereof, such that the resistivity of the light shielding film 1108 becomes from $1\times10^6$ to $1\times10^{12}$ Ωm (preferably between $1\times10^8$ and $1\times10^{10}$ Ωm) in order to prevent static electric damage to the TFTs when forming the light shielding film 1108. The light shielding film 1108 is formed on the first interlayer insulating film 1107 here, but a lamination film in which the light shielding film 1108 is laminated with a resin film that is transparent with respect to visible light may also be used.

An example is shown in embodiment 9 in which the light shielding film is formed over the entire surface, but it may also be selectively placed by performing suitable patterning. Note that there are no specific limitations placed on the position in which the light shielding film is formed, and it may be formed contacting the light emitting elements, and it may also be formed through an insulating film or a conductive film.

After thus obtaining the state of FIG. 12, external light is absorbed to a certain extent by the surface of the light shielding film 1108 made from the insulating film in which metallic particles or carbon particles are distributed, and reflected light is reduced with a light emitting device obtained in accordance with embodiment 1. It is therefore difficult to see the external environment in the observation surface. Accordingly, it is possible to obtain a good picture quality. Further, high cost circular polarization films are not used, and the light emitting device can consequently be made low cost.

Note that it is possible to freely combine embodiment 9 with any one of embodiments 1 to 8.

[Embodiment 10]

Figure 14A:
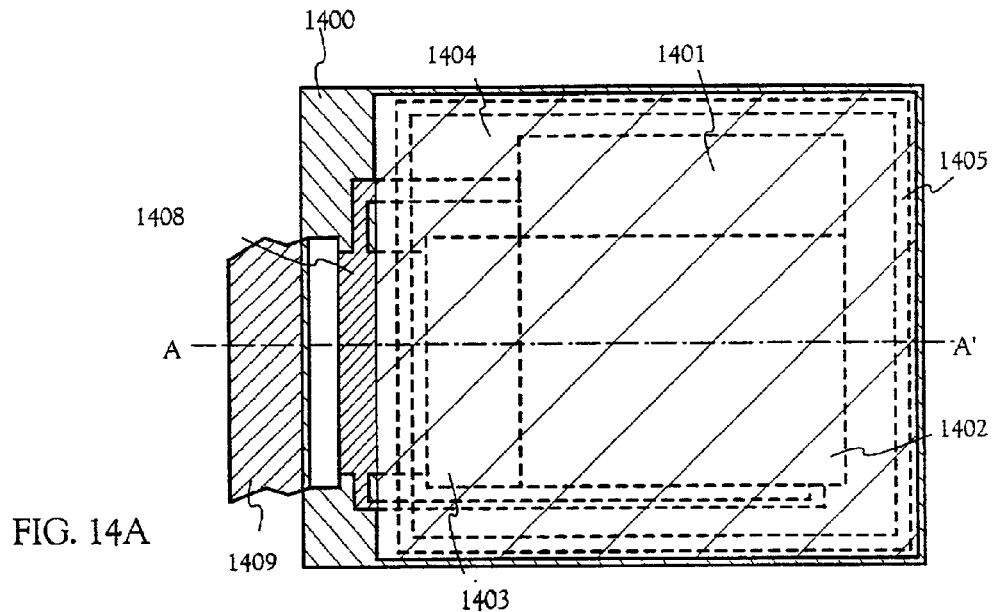
FIGS. 14A and 14B are diagrams showing a top surface diagram and a portion of a cross section, respectively, of an EL display device of Embodiment 10.
Figure 14B:
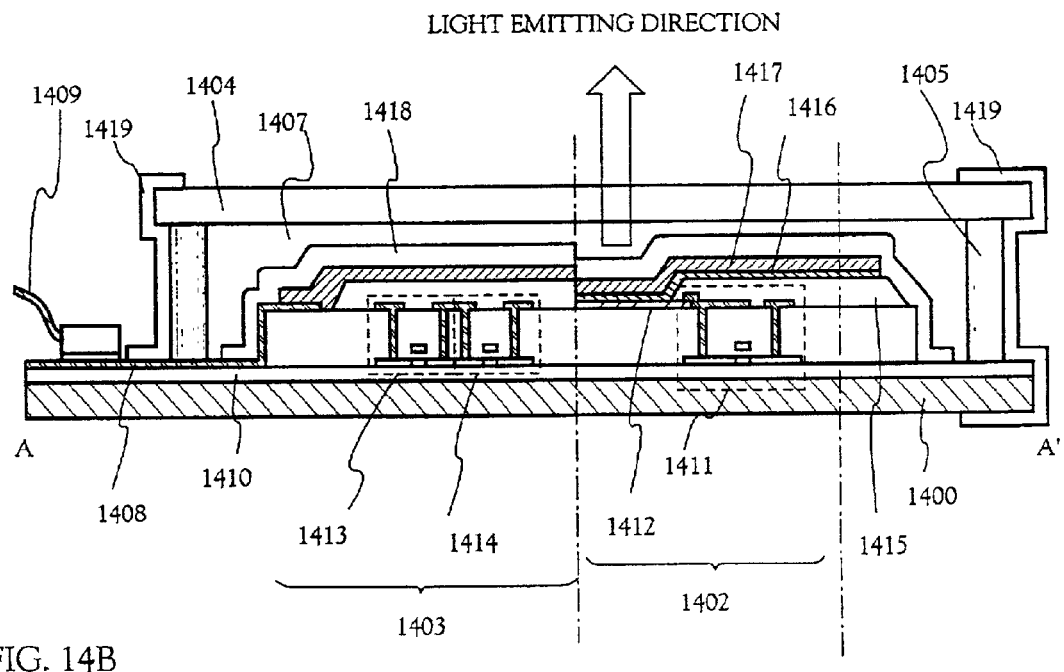

An example of applying a DLC film (a diamond like carbon film) as a passivation film with the present invention is shown in FIG. 14 in embodiment 10.

First, manufacturing is performed in accordance with embodiment 5 up through the formation of an EL layer 1416 and an anode 1417. A transparent conductive film made from an oxide conductive film containing zinc, for example zinc oxide (ZnO), an oxide conductive film in which gallium oxide is added to zinc oxide, or an oxide conductive film containing from 2 to 20% zinc oxide (ZnO) in indium oxide is used as the anode 1417 here. A DLC film having a film thickness of 2 to 50 nm is formed as a passivation film 1418 covering the anode.

Note that ECR plasma CVD, RF plasma CVD, microwave plasma CVD, or sputtering may be used for film formation of the DLC film. The DLC film has a Raman spectra distribution with a non-symmetrical peak at approximately 1550 $cm^{-1}$, and a shoulder at approximately 1300 $cm^{-1}$. It shows a hardness of between 15 and 25 GPa when measured by a microhardness meter. This type of carbon film possesses a role in preventing incursion of oxygen and moisture, and at the same time protects the surface of the a resin substrate. The incursion of substances from the outside which promote deterioration due to oxidation of an EL layer, such as moisture and oxygen, can be prevented. An EL display device having high reliability can therefore be obtained.

Further, a cover material 1404 is joined by a sealing material 1405. Note that spacers made from a resin film may also be formed in order to ensure the spacing between the cover material 1404 and the EL elements. A space 1407 on the inside of the sealing material 1405 is then filled with an inert gas such as nitrogen. Note that it is preferable to use an epoxy resin as the sealing material 1405. Further, it is preferable that the sealing material 1405 be a material which is able to block as much moisture and oxygen as possible from passing through it. In addition, a substance possessing a moisture absorption effect or a substance possessing an oxidation prevention effect may also be included on the inside of the space 1407.

FRP (fiberglass reinforced plastic), PVF (polyvinyl fluoride), mylar, polyester, and acrylic can be used as a plastic substrate material structuring the cover material 1404.

Furthermore, an additional DLC film 1419 is formed so as to cover the side faces (exposed surfaces) and the covering material, after joining the cover material 1404 using the sealing material 1405. It is necessary to take care here so that the DLC film is not formed in a portion at which an external input terminal (FPC) is formed. A mask may be used so that the DLC film is not formed there, and the external input terminal portion may be covered by a tape, such as teflon (TM) used as a masking tape in a CVD apparatus so that the DLC film may not be formed.

The EL elements can be completely cutoff from the outside by sealing the EL elements in the space 1407 with the above structure, and the incursion of substances from the outside which promote degradation by oxidation of the EL layers, such as moisture and oxygen, can be prevented. A light emitting device having high reliability can therefore be obtained.

Note that it is possible to freely combine embodiment 10 with any one of embodiments 1 to 9.

[Embodiment 11]

Figure 15A:
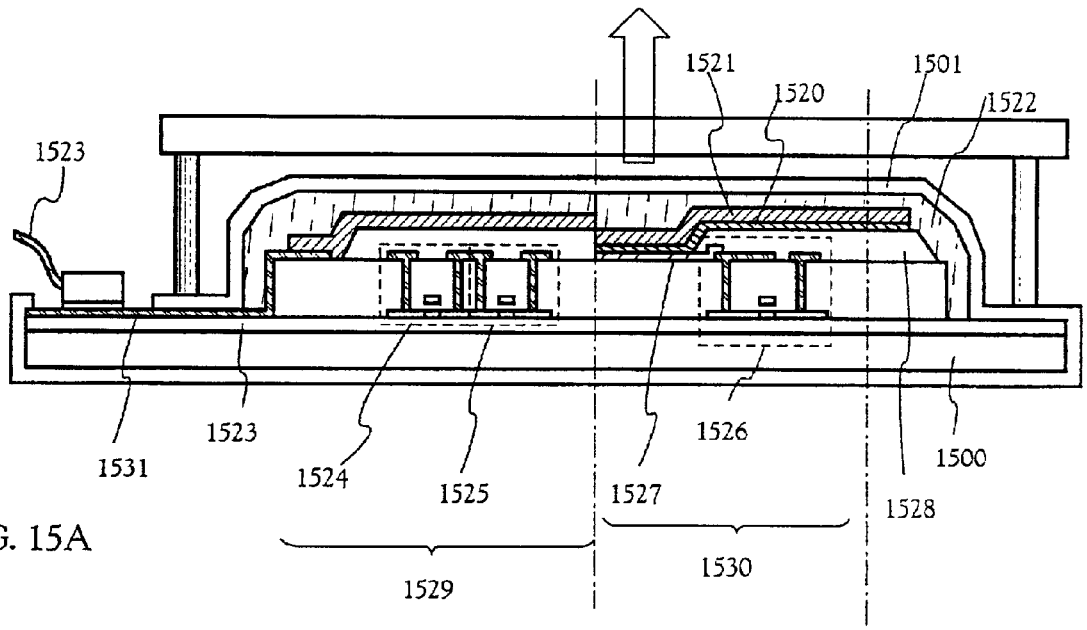
FIGS. 15A and 15B are diagrams showing a portion of a cross section of an EL display device of Embodiments 11 and 12, respectively.

An example of a case of using a transparent conductive film made from ITO (an alloy of indium oxide and tin oxide) as an anode, differing from that of embodiment 10, is shown in FIG. 15A in embodiment 11.

First, manufacturing is performed in accordance with embodiment 5 up through the formation of an EL layer 1520 and an anode 1521. It is difficult to laminate a DLC film for a case of using a transparent conductive film made from ITO (an alloy of indium oxide and tin oxide) as an anode 1521. A DLC film having a film thickness of 2 to 50 nm is used in embodiment 11 after forming a sealing material 1522 made from an organic resin film as a buffer. Note that, as shown in FIG. 15A, a DLC film 1501 is formed over the entire surface, including the back surface of a substrate 1500. There are no limitation to forming the DLC film over the entire surface, of course, and the DLC film may be formed at least on the front surface (exposed surface) of a sealing material 1522 after completely covering light emitting elements using the sealing material 1522. It is necessary to take care here so that the DLC film is not formed in a portion at which an external input terminal (FPC) 1523 is formed. A mask may be used so that the DLC film is not formed there, and the external input terminal portion may be covered by a tape, such as teflon (TM) used as a masking tape in a CVD apparatus so that the DLC film may not be formed there.

Passivation by the DLC film can thus be accomplished even if ITO is used as the anode 1521.

Further, reference numeral 1523 indicates an insulating film; 1524, an n-channel TFT; 1525, a p-channel TFT; 1526, an electric current control TFT of n-channel TFT; 1527, a pixel electrode (a cathode); 1528, bank; 1529, a gate side driver circuit; 1530, a pixel portion; and 1531, a connection wiring.

Note that it is possible to freely combine embodiment 11 with any one of embodiments 1 to 9.

[Embodiment 12]

Figure 15B:
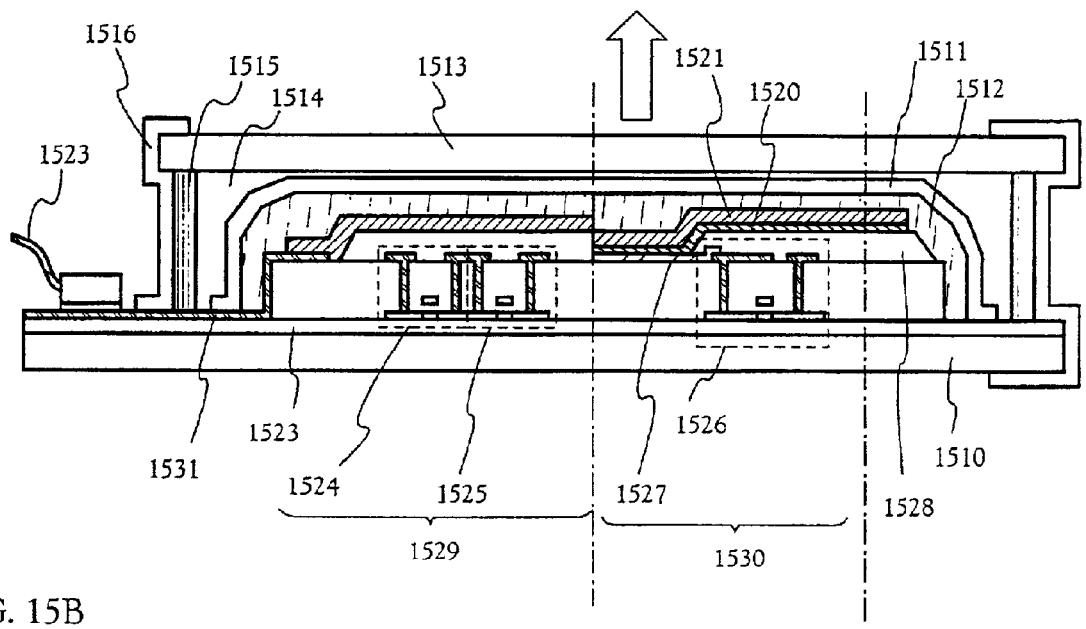

An example of forming DLC films on the end surfaces of an EL light emitting device is shown in FIG. 15B in embodiment 12.

The end surfaces of an EL light emitting device have a structure in which a sealing material, used in order to join a fixing substrate, is exposed after attaching the fixing substrate.

Incursion of substances from the outside, such as moisture and oxygen which promote degradation of EL layers due to oxidation, through the sealing material is prevented in embodiment 12. A DLC film 1511 is therefore formed in the end surface so as to cover the sealing material 1512.

Furthermore, as shown in FIG. 15B, a structure in which light emitting elements formed on a substrate 1510 are covered by the first DLC film 1511 after being covered by a sealing material 1512, and in addition a cover material 1513 is joined by an adhesive material 1515, and a second DLC film 1516 formed on the periphery and then covered with an adhesive may also be used. A space 1514 on the inside of the adhesive 1515 may also be filled with an inert gas, such as nitrogen. In addition, a substance possessing a moisture absorption effect, or a substance possessing an oxidation preventative effect may also be included on the inside of the space 1514.

Incursion of substances from the outside, such as moisture and oxygen, which promote degradation of the EL layers can thus be even better prevented. A light emitting device having high reliability is therefore obtained.

Further, it is preferable to use a thin film made from a material having a high absorption coefficient with respect to visible light (light shielding film) as an insulating film contacting pixel electrodes, namely an insulating film covering TFTs, for a case in which a conductive film which is transparent, or translucent, with respect to visible light is used in pixel electrodes. An insulating film (preferably a resin film) in which metallic particles or carbon particles are distributed can be given as a typical example. When using this type of structure, almost all external light is absorbed by the light shielding film when reaching the light shielding film, being reduced to a level at which reflected light does not become a problem, and therefore a high cost circular polarizing film need not be used.

Note that a DLC film may also be formed covering the entire surface, not only the edge surfaces. However, it is necessary to form a mask such that the DLC film is not formed in portions in which extraction electrodes are formed.

Further, an example is shown in embodiment 12 in which the DLC film is formed after removing the substrate holder, but the substrate holder may also be removed after forming the DLC film.

Note that it is possible to freely combine embodiment 12 with any one of embodiments 1 to 11.

[Embodiment 13]

An example of placing a drying agent on a driver circuit formed on an element formation substrate is shown by embodiment 13.

A drying agent is sealed by a fixing substrate after being placed on a driver circuit after an anode is formed in accordance with embodiment 5. There is no influence on an image displayed even though the drying agent is arranged on the driver circuit.

A powdered moisture absorbing substance (barium oxide, for example) may be combined with another material and then arranged as a film or as a solid. A method may also be used in which the powder state moisture absorbing substance is sealed by a sheet which is transparent to the passage of moisture.

Degradation due to oxidation of EL layers by substances such as moisture and oxygen from outside can thus be prevented. An EL light emitting device having high reliability is therefore obtained.

Note that it is possible to freely combine embodiment 13 with any one of embodiments 1 to 12.

[Embodiment 14]

Embodiment 14 is example in which moisture absorbing substance is contained on banks arranged in a pixel portion, or is contained in the banks, differing from embodiment 13.

After manufacturing up to formation of a pixel electrode in accordance with embodiment 5, a material layer is formed which then becomes banks. A role as a drying agent is fulfilled by including a moisture absorbing substance in the material layer. Conversely, a lamination structure in which a drying agent is formed on the banks may also be used.

Next, an EL layer and an anode of an EL element are formed on the pixel electrode.

Degradation due to oxidation of the EL layer by substances such as moisture and oxygen from the outside can thus be prevented. An EL display device having high reliability is therefore obtained.

Note that it is possible to freely combine embodiment 14 with any one of embodiments 1 to 12.

[Embodiment 15]

It is difficult to form a plurality of integrated circuits (such as memory, CPUs, D/A converters) on the same substrate when the method of manufacture of embodiment 5, in which the number of masks is reduced, is used. An IC chip prepared with circuits such as memory, CPUs, and D/A converters is therefore mounted by a COG (chip on glass) method or a TAB (tape automated bonding) method. An example of forming a memory circuit in an IC chip, and mounting the IC chip by COG is shown in embodiment 15.

Figure 13A:
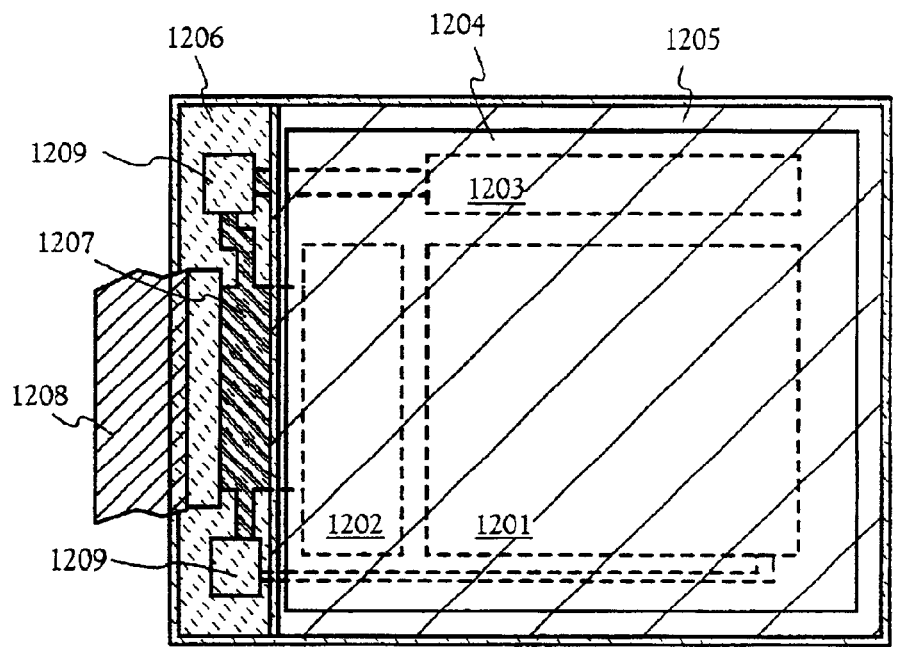
FIGS. 13A and 13B are diagrams showing a top surface diagram and a portion of a cross section, respectively, of an EL display device of Embodiment 15.

FIG. 13A shows a top surface diagram of an EL display device on which an IC chip 1209 is mounted.

Reference numeral 1201, shown by a dotted line, denotes a pixel portion, reference numeral 1202 denotes a source side driver circuit, reference numeral 1203 denotes a gate side driver circuit, and reference numeral 1209 denotes an IC chip. Further, reference numeral 1204 denotes a fixing substrate, reference numeral 1205 denotes a first sealing material, and reference numeral 1206 denotes a second sealing material.

Note that reference numeral 1207 denotes wirings for transferring signals input to the source side driver circuit 1202 and the gate side driver circuit 1203, and video signals and clock signals are received from an FPC (flexible printed circuit) 1208 which becomes an external input terminal. Note also that, although only the FPC is shown in the figures here, a printed wiring board (PWB) may also be attached to the FPC.

Figure 13B:
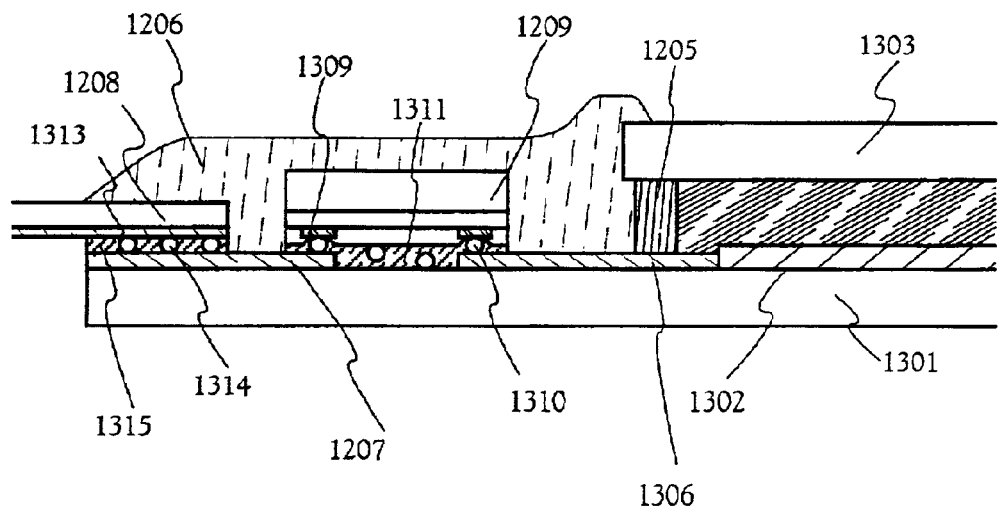

Further, FIG. 13B is a figure showing a portion of a cross section of an EL display device to which an IC chip is mounted.

A pixel portion 1302 containing EL elements, an extraction wiring 1306, and the connection wiring and input-output terminal 1207 are formed on a metallic substrate 1301. A fixing substrate 1303 is bonded to the metallic substrate 1301 by a first sealing material 1304.

The FPC 1208 is bonded by an anisotropic conductive material to one end of the connection wiring and input-output terminal 1207. The anisotropic conductive material is made from a resin 1315 and from conductive particles 1314, having a diameter on the order of several tens to several hundreds of $\mu$m, of a material such as Au which have been plated to the surface of the resin 1315. The connection wiring and input-output terminal 1207 and a wiring 1313 formed in the FPC 1208 are electrically connected by the conductive particles 1314. The IC chip 1209 is also similarly bonded to the metallic substrate by an anisotropic conductive material, and an input-output terminal 1309 formed in the IC chip 1209 is electrically connected to the extraction line 1306 or to the connection wiring and input-output terminal 1207 by conductive particles 1310 mixed into a resin 1311.

The IC chip mounting method is not limited to the method based upon FIGS. 13A and 13B, and in addition to the method explained here, it is possible to use known COG method, wire bonding method, or TAB method.

[Embodiment 16]

The driver circuit and the pixel portion formed through carrying out the present invention may be applied to various electro-optical devices (an active matrix substrate liquid crystal display, an active matrix EL display and an active matrix EC display). Namely, the present invention may be embodied in all the electronic equipments that incorporate those electro-optical devices as display portion.

As such an electronic equipment, a video camera, a digital camera, a head mount display (goggle-type display), a navigation system for vehicles, a car mounted audio set, a personal computer, and a portable information terminal (a mobile computer, a cellular phone, or an electronic book, etc.) may be enumerated. Examples of those are shown in FIGS. 16A–16F and 17A–17C.

FIG. 16A shows a personal computer comprising a main body 2001, an image inputting portion 2002, a display portion 2003, and a key board 2004. The present invention is applicable to the display portion 2003.

FIG. 16B shows a video camera comprising a main body 2101, a display portion 2102, a voice input portion 2103, operation switches 2104, a battery 2105, and an image receiving portion 2106. The present invention is applicable to the display portion 2102.

FIG. 16C shows a mobile computer comprising a main body 2201, a camera portion 2202, an image receiving portion 2203, an operation switch 2204, and a display portion 2205. The present invention is applicable to the display portion 2205.

FIG. 16D shows a goggle-type display comprising a main body 2301, a display portion 2302 and arm portions 2303. The present invention is applicable to the display portion 2302.

FIG. 16E shows a player that employs a recording medium in which programs are recorded (hereinafter referred to as a recording medium), and comprises a main body 2401, a display portion 2402, a speaker portion 2403, a recording medium 2404, and an operation switch 2405. Incidentally, this device uses as the recording medium a DVD (digital versatile disc), a CD and the like to serve as a tool for enjoying music or movies, for playing video games and for connecting to the Internet. The present invention is applicable to the display unit 2402.

FIG. 16F shows a digital camera comprising a main body 2501, a display unit 2502, an eye piece section 2503, operation switches 2504, and an image receiving unit (not shown) and the like. The present invention is applicable to the display portion 2502.

Figure 17A:
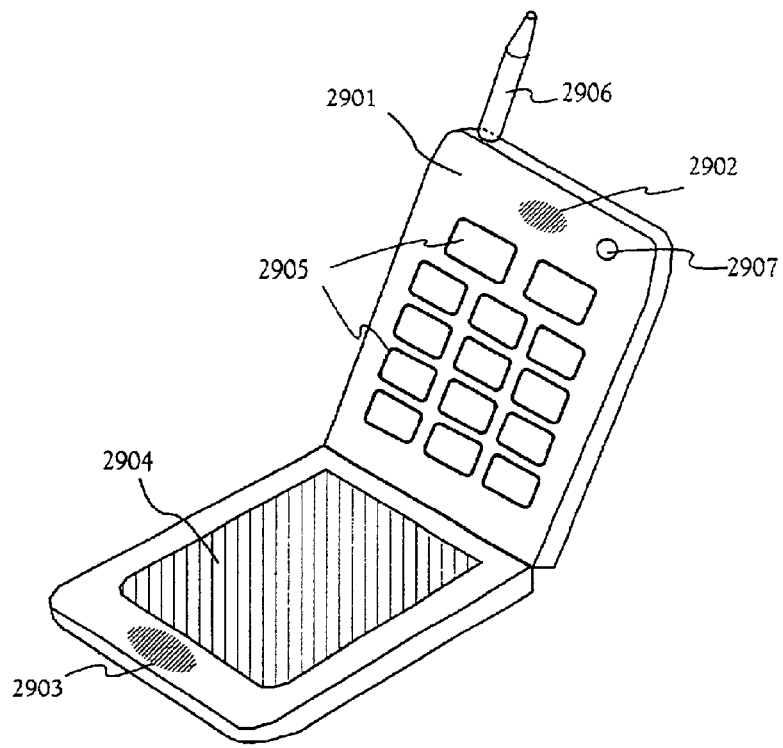
FIGS. 17A to 17C are diagrams showing examples of electronic equipment of Embodiment 16.

FIG. 17A shows a cellular phone comprising a main body 2901, a sound output portion 2902, a sound input portion 2903, a display portion 2904, an operation switches 2905, an antenna 2906 and an image input portion (CCD, an image sensor and so forth) 2907 and the like. The present invention is applicable to the display portion 2904.

Figure 17B:
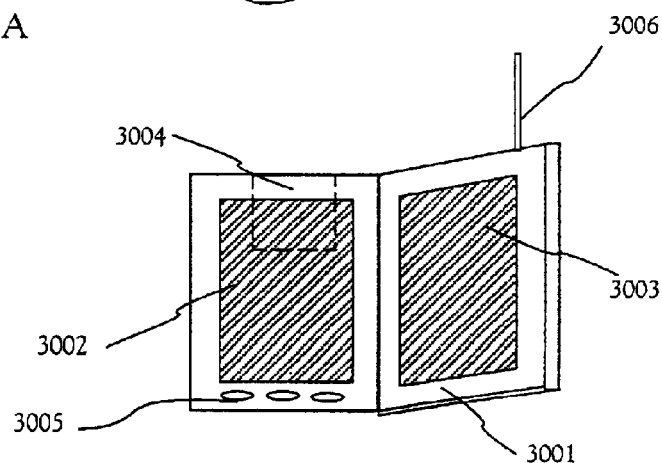

FIG. 17B shows a portable book (electronic book) comprising a main body 3001, a display portion 3002, 3003, a recording medium 3004, an operation switches 3005 and an antenna 3006 and the like. The present invention is applicable to the display portion 3002 and 3003.

Figure 17C:
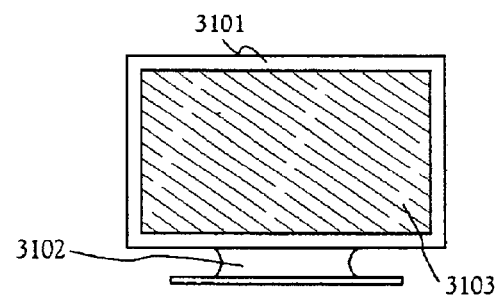
Figure 18:
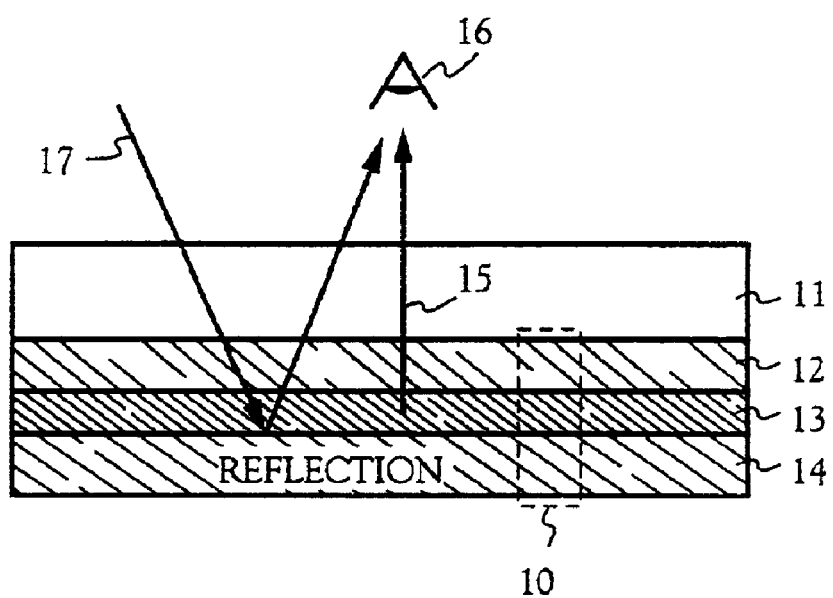
FIG. 18 is a diagram showing a conventional example.

FIG. 17C shows a display comprising a main body 3101, a support stand 3102 and the display portion 3103 and the like. The present invention is applicable to the display portion 3103. Further, the display shown in FIG. 17C is a medium-small type or big type, for example, 5 to 20 inches display size. It is preferable to mass-produce by multiple cutting from a substrate which has one side 1 m sized for forming such size of the display portion.

As described above, application fields of the present invention is extremely broad, and is capable of being applied to every field of electronic equipment. Especially the present invention is advantageous in the case that the device is a small size, and is useful to lighten the above-mentioned portable information terminal. In addition, the electronic equipment according to the present embodiment can be embodied by using any constitution comprising any combination of Embodiments 1 to 15.

A light weight, low cost light emitting device can be provided by the present invention by forming light emitting elements on a flexible film made from a metallic substrate.

What is claimed is:

1. A light emitting device comprising:
   a substrate having a metallic surface;
   a first insulating film over the substrate having the metallic surface;
   at least one thin film transistor over the first insulating film;
   a second insulating film over the at least one thin film transistor;
   a light shielding film over the second insulating film; and
   a light emitting element over the light shielding film;
   said light emitting element including:
      an anode;
      a cathode; and
      an EL material interposed between the anode and the cathode; and
   wherein a thickness of the substrate having the metallic surface is in a range of 5 to 30 $\mu$m, and
   wherein the light shielding film is made of a resin film.

2. A device according to claim 1,
   wherein the substrate having the metallic surface is a heat resistive metallic substrate.

3. A device according to claim 1,
   wherein a maximum surface roughness (Rmax) of the substrate is equal to or less than 1 $\mu$m.

4. A device according to claim 1,
   wherein a radius of curvature of convex portions existing on a surface of the substrate is equal to or greater than 1 $\mu$m.

5. A device according to claim 1,
   wherein the light emitting device is one selected from the group consisting of a video camera, a digital camera, a goggle-type display, a navigation system for vehicles, a personal computer, and a portable information terminal.

6. A device according to claim 1,
   wherein the light shielding film is formed in contact with the cathode.

7. A device according to claim 1,
   wherein the shielding film is formed adjacent to the cathode with an insulating film or a conductive film interposed therebetween.

8. A light emitting device comprising:
   a metal substrate;
   an insulating film over a first surface of the metal substrate;
   a light emitting element over the insulating film;
   said light emitting element including:
      an anode;
      a cathode; and
      an EL material interposed between the anode and the cathode, and
   a substrate holder under a majority of a surface of the metal substrate opposite the first surface,
   wherein the substrate holder is made of stainless steel, ceramic or alumina.

9. A device according to claim 8,
   wherein the metal substrate is a heat resistive metallic substrate.

10. A device according to claim 9,
    wherein a thickness of the heat resistive metallic substrate is in a range of 5 to 30 $\mu$m.

11. A device according to claim 8,
wherein a maximum surface roughness (Rmax) of the substrate is equal to or less than 1 µm.

12. A device according to claim 8,
wherein a radius of curvature of convex portions existing on a surface of the substrate is equal to or greater than 1 µm.

13. A device according to claim 8,
wherein the light emitting device is one selected from the group consisting of a video camera, a digital camera, a goggle-type display, a navigation system for vehicles, a personal computer, and a portable information terminal.

14. A light emitting device comprising:
a substrate holder;
a metal substrate over the entire surface of the substrate holder;
an insulating film over the metal substrate; and
a light emitting element over the insulating film;
said light emitting element including:
an anode;
a cathode; and
an EL material interposed between the anode and the cathode; and
a light shielding film provided between the light emitting element and the metal substrate and overlapped with the light emitting element,
wherein the substrate holder is made of stainless steel, ceramic or alumina.

15. A device according to claim 14,
wherein the metal substrate is a heat resistive metallic substrate.

16. A device according to claim 15,
wherein a thickness of the heat resistive metallic substrate is in a range of 5 to 30 µm.

17. A device according to claim 14,
wherein a maximum surface roughness (Rmax) of the substrate is equal to or less than 1 µm.

18. A device according to claim 14,
wherein a radius of curvature of convex portions existing on a surface of the substrate is equal to or greater than 1 µm.

19. A device according to claim 14,
wherein the light emitting device is one selected from the group consisting of a video camera, a digital camera, a goggle-type display, a navigation system for vehicles, a personal computer, and a portable information terminal.

20. A device according to claim 14,
wherein the light shielding film is formed in contact with the cathode.

21. A device according to claim 14,
wherein the shielding film is formed adjacent to the cathode with an insulating film or a conductive film interposed therebetween.

22. A light emitting device comprising:
a metal substrate;
a first insulating film over a first surface of the metal substrate;
at least one thin film transistor over the first insulating film;
a second insulating film over the at least one thin film transistor;
a first electrode over the second insulating film wherein the first electrode is electrically connected with the thin film transistor;
a light emitting layer over the first electrode;
a second electrode over the light emitting layer; and
a substrate holder under a majority of a surface of the metal substrate opposite the first surface,
wherein the substrate holder is made of stainless steel, ceramic or alumina.

23. A device according to claim 22,
wherein the metal substrate is a heat resistive metallic substrate.

24. A device according to claim 23,
wherein a thickness of the heat resistive metallic substrate is in a range of 5 to 30 µm.

25. A device according to claim 22,
wherein a maximum surface roughness (Rmax) of the substrate is equal to or less than 1 µm.

26. A device according to claim 22,
wherein a radius of curvature of convex portions existing on a surface of the substrate is equal to or greater than 1 µm.

27. A device according to claim 22,
wherein the light emitting device is one selected from the group consisting of a video camera, a digital camera, a goggle-type display, a navigation system for vehicles, a personal computer, and a portable information terminal.

* * * * *